US008103935B2

(12) United States Patent
Matsumoto et al.

(10) Patent No.: US 8,103,935 B2
(45) Date of Patent: Jan. 24, 2012

(54) TEST MATRIX GENERATING METHOD, ENCODING METHOD, DECODING METHOD, COMMUNICATION APPARATUS, COMMUNICATION SYSTEM, ENCODER AND DECODER

(75) Inventors: Wataru Matsumoto, Chiyoda-ku (JP); Rui Sakai, Chiyoda-ku (JP); Hideo Yoshida, Chiyoda-ku (JP); Takahiko Nakamura, Chiyoda-ku (JP); Yoshikuni Miyata, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 785 days.

(21) Appl. No.: 12/063,507

(22) PCT Filed: Jul. 31, 2006

(86) PCT No.: PCT/JP2006/315139
§ 371 (c)(1),
(2), (4) Date: Aug. 14, 2008

(87) PCT Pub. No.: WO2007/018066
PCT Pub. Date: Feb. 15, 2007

(65) Prior Publication Data
US 2009/0265600 A1    Oct. 22, 2009

(30) Foreign Application Priority Data
Aug. 10, 2005 (JP) ................................. 2005-232665

(51) Int. Cl.
G06F 11/00    (2006.01)
(52) U.S. Cl. ........................ 714/758; 714/759
(58) Field of Classification Search .................. 714/758, 714/759, 760, 757, 791, 793, 795
See application file for complete search history.

(56) References Cited

U.S. PATENT DOCUMENTS

| 7,000,177 | B1 * | 2/2006 | Wu et al. ........................ 714/801 |
| 7,168,033 | B1 * | 1/2007 | Wu et al. ........................ 714/801 |
| 7,451,385 | B2 * | 11/2008 | Ha et al. ........................ 714/800 |
| 7,609,839 | B2 * | 10/2009 | Watanabe et al. ............. 380/278 |

(Continued)

FOREIGN PATENT DOCUMENTS

KR    10-2005-0046471    5/2005

(Continued)

OTHER PUBLICATIONS

Hachiro Fujita, et al., "An Algebraic Method for Constructing Efficiently Encodable Irregular LDPC Codes", Proc. International Symposium on Information Theory, XP010845663, Sep. 4, 2005, 5 Pages.

(Continued)

Primary Examiner — Dieu-Minh Le
(74) Attorney, Agent, or Firm — Oblon, Spivak, McClelland, Maier & Neustadt, L.L.P.

(57) ABSTRACT

A regular quasi-cyclic matrix is prepared, a conditional expression for assuring a predetermined minimum loop in a parity check matrix is derived, and a mask matrix for converting a specific cyclic permutation matrix into a zero-matrix based on the conditional expression and a predetermined weight distribution is generated. The specific cyclic permutation matrix is converted into the zero-matrix to generate an irregular masking quasi-cyclic matrix. An irregular parity check matrix in which the masking quasi-cyclic matrix and a matrix in which the cyclic permutation matrices are arranged in a staircase manner are arranged in a predetermined location.

35 Claims, 18 Drawing Sheets

U.S. PATENT DOCUMENTS

| | | |
|---|---|---|
| 2005/0149841 A1 | 7/2005 | Kyung et al. |
| 2006/0036926 A1* | 2/2006 | Hocevar .................. 714/758 |

FOREIGN PATENT DOCUMENTS

| | | |
|---|---|---|
| KR | 10-2005-0060587 | 6/2005 |
| WO | 2004 006444 | 1/2004 |
| WO | 2004 047019 | 6/2004 |
| WO | 2004 107640 | 12/2004 |
| WO | 2005 107081 | 11/2005 |

OTHER PUBLICATIONS

Satoshi Gounai, et al., "Lowering Error Floors of Irregular LDPC Code on Fast Fading Environment with and without Perfect CSI", Proc. Vehicular Technology Conference, vol. 1, XP010855472, May 30, 2005, pp. 634-638.

Mohammadreza Yazdani, et al., "Irregular Rate-Compatible LDPC Codes for Capacity-Approaching Hybrid-ARQ Schemes", Proc. Canadian Conference of Electrical and Computer Engineering, vol. 1, XP010733447, May 2, 2004, pp. 303-306.

Yifei Zhang, et al., "Structured Eira Codes*", Proc. Of the 38th Asimiolar Conference on Signals, Systems and Computers, vol. 2, XP010781401, Nov. 7, 2004, pp. 2005-2009.

Y. Y. Tai, et al., "Construction of Structured LDPC Codes for AWGN and Binary Erasure Channels", Proc. Intern. Conference on Wireless Networks, Communications, and Mobile Computing, vol. 1, XP010887950, Jun. 13, 2005, pp. 146-151.

Sundararajan Sankaranarayanan[1] ", A Systematic Construction of Irregular Low-Density Parity-Check Codes from Combinatorial Designs", Proceedings 2003 IEEE International Symposium on Information Theory, XP010657029, Jun. 29-Jul. 4, 2003, 1 Page.

Fossorier, Marc P. C., "Quasi-Cyclic Low-Density Parity-Check Codes From Circulant Permutation Matrices", IEEE Transactions on Information Theory, vol. 50, No. 8, pp. 1788 to 1793, 2004.

Fujisawa, Masaya et al., "On a Class of Quasi-Cyclic Low-Density Parity-Check Codes Based on Cyclic Difference Families", IEICE Technical Report, vol. 104, No. 302, pp. 19 to 24, 2004.

Johnson, Sarah et al., "A Family of Irregular LDPC Codes With Low Encoding Complexity", IEEE Communications Letters, vol. 7, No. 2, pp. 79 to 81, 2003.

Matsumoto, Wataru et al., "Cyclic Approximated Min Algorithm", IEICE Technical Report, vol. 105, No. 196, pp. 1 to 6, 2005.

Fossorier, Marc P. C., "Quasi-Cyclic Low Density Parity Check Codes", ISIT 2003, p. 150, 2003.

U.S. Appl. No. 12/376,344, filed Feb. 4, 2009, Matsumoto, et al.
U.S. Appl. No. 12/160,432, filed Jul. 10, 2008, Matsumoto, et al.
U.S. Appl. No. 12/278,185, filed Aug. 4, 2008, Matsumoto, et al.
U.S. Appl. No. 12/097,390, filed Jun. 13, 2008, Matsumoto, et al.

* cited by examiner

TEST MATRIX GENERATING METHOD, ENCODING METHOD, DECODING METHOD, COMMUNICATION APPARATUS, COMMUNICATION SYSTEM, ENCODER AND DECODER

TECHNICAL FIELD

The present invention relates to an encoding technology in digital communications, in particular to a check-matrix generating method for generating a parity check matrix for low-density parity check (LDPC) codes, an encoding method for encoding predetermined information bits using the parity check matrix, and a communication apparatus.

BACKGROUND ART

Hereinafter, a conventional communication system that employs LDPC codes as an encoding system will be explained. Here, a case in which quasi-cyclic (QC) codes (see Non-patent Document 1) are employed as one example of the LDPC codes will be explained.

First, a flow of encoding/decoding processing in the conventional communication system that employs the LDPC codes as the encoding system will be explained briefly.

An LDPC encoder in a communication apparatus on a transmission-side (it is called a transmission apparatus) generates a parity check matrix H by a conventional method that will be explained below. Further, the LDPC encoder generates, for example, a generator matrix G with K-row×N-column (K: information length, N: code length). Note that when the parity check matrix for LDPC is defined as H (M-row× N-column), the generator matrix G will be a matrix that satisfies $GH^T=0$ (T is a transposed matrix).

Thereafter, the LDPC encoder receives messages ($m_1, m_2, \ldots, m_K$) with the information length K to generate a code C as represented by following Equation (1) using these messages and the generator matrix G, where $H(c_1, C_2 \ldots, C_N)^T = 0$.

$$C = (m_1, m_2, \ldots, m_K)G \quad (1)$$
$$= (c_1, c_2, \ldots, c_N)$$

A modulator in the transmission apparatus then performs digital modulation to the code C generated by the LDPC encoder according to a predetermined modulation system, such as binary phase shift keying (BPSK), quadrature phase shift keying (QPSK), multi-value quadrature amplitude modulation (QAM), and transmits a modulated signal $x=(x_1, x_2, \ldots, x_N)$ to a reception apparatus.

Meanwhile, in a communication apparatus on a reception-side (which is called a reception apparatus), a demodulator performs digital demodulation to a received modulated signal $y=(y_1, Y_2, \ldots, Y_N)$ according to the modulation system such as BPSK, QPSK, multi-value QAM, or the like, and an LDPC decoder in the reception apparatus further performs repetition decoding to demodulated results based on a "sum-product algorithm" to thereby output the decoded results (corresponding to the original messages $m_1, m_2, \ldots, m_K$).

The conventional parity check-matrix generating method for the LDPC codes will now be explained concretely. As the parity check matrix for the LDPC codes, a following parity check matrix of QC codes is proposed, for example, in following Non-patent Document 1 (see FIG. 17). The parity check matrix of the QC codes shown in FIG. 17 is a matrix in which cyclic permutation matrices (P=5) with 5-row×5-column are arranged in a vertical direction (J=3) and in a horizontal direction (L=5).

Generally, a parity check matrix $H_{QC}$ of the (J, L) QC codes with M (=pJ) rows×N (=pL) columns can be defined as following Equation (2). Incidentally, p is an odd prime number (other than 2), L is the number of cyclic permutation matrices in the parity check matrix $H_{QC}$ in a transverse direction (column direction), and J is the number of cyclic permutation matrices in the parity check matrix $H_{QC}$, in a longitudinal direction (row direction).

[Numerical Expression 1]

$$H_{QC} = \begin{bmatrix} I(p_{0,0}) & I(p_{0,1}) & \ldots & I(p_{0,L-1}) \\ I(p_{1,0}) & I(p_{1,1}) & \ldots & I(p_{1,L-1}) \\ \vdots & \vdots & \ddots & \vdots \\ I(p_{J-1,0}) & I(p_{J-1,1}) & \ldots & I(p_{J-1,L-1}) \end{bmatrix} \quad (2)$$

example:

$$p = 5, 1(0) = \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix}$$

Where, in $0 \leq j \leq J-1$ and $0 \leq l \leq L-1$, $I(p_{j,l})$ are cyclic permutation matrices in which positions of a row index: r ($0 \leq r \leq P-1$), and a column index: "$(r+p_{j,l})$mod p" are "1", and other positions are "0".

In addition, when the LDPC codes are designed, performance degradation generally occurs when there are many loops with a short length, and thus it is necessary to increase an internal diameter and to reduce the number of loops with the short length (loop 4, loop 6, or the like).

Incidentally, FIG. 18 is a view showing one example of the check matrix represented by a Tanner graph, wherein in the binary parity check matrix H of $\{0, 1\}$ with M-row×N-column, nodes corresponding to each column are called bit nodes $b_n$ ($1 \leq n \leq N$) (corresponding to circles in the figure), and nodes corresponding to each row are called check nodes $c_m$ ($1 \leq m \leq M$) (corresponding to rectangles in the figure), and further, when there is "1" at an intersection of the row and the column of the check matrix, a bipartite graph in which the bit nodes and the check nodes are connected with branches is called the Tanner graph. In addition, the loop represents a closed loop that starts from a specific node (corresponding to circles and rectangles in the figure) and ends at that node as shown in FIG. 18, and the internal diameter means the minimum loop thereof. Moreover, a loop length is represented by the number of branches constituting the closed loop, and is simply represented as loop 4, loop 6, loop 8, ... according to the length.

Meanwhile, in following Non-patent Document 1, a range of an internal diameter g in the parity check matrix $H_{QC}$ of (J,L) QC-LDPC codes is given by "$4 \leq g \leq 12$ (where g is an even number)". However, it is easy to avoid g=4 and, and it results in $g \geq 6$ in many cases.

Non-patent Document 1: M. Fossorier, "quasi-cyclic Low Density Parity Check Code", ISIT2003, p. 150, Japan, Jun. 29-Jul. 4, 2003.

DISCLOSURE OF INVENTION

Problem to be Solved by the Invention

According to the conventional technology, however, while codes equal to loop 6 or more can be easily constituted with a regular configuration, a regular (weights of the row and the column are uniform) parity check matrix for the LDPC codes is generated, so that there is a problem that an irregular (weights of the row and the column are nonuniform) parity check matrix that is generally considered to have excellent performance is not specified.

Additionally, it is necessary to prepare the generator matrix G aside from the check matrix H upon encoding, so that there is a problem that an additional circuit for calculating the generator matrix G is required. Moreover, it is necessary to prepare the check matrixes H corresponding to the number of encoding rates in dealing with a plurality of encoding rates, so that there is a problem that the circuit scale is further increased.

The present invention is made in view of the situation, and aims at obtaining a communication apparatus that can deal with the irregular (weights of the row and the column are nonuniform) parity check matrix for the LDPC codes, and whose circuit scale can be further reduced as compared with that of the conventional technology.

Means for Solving Problem

To solve the above problems and to achieve the object, a check-matrix generating method for generating a parity check matrix for LDPC codes, according to the present invention, includes a mask-matrix generating step of preparing a regular quasi-cyclic matrix in which cyclic permutation matrices are arranged in row and column directions and specific regularity is given to the cyclic permutation matrices, deriving a conditional expression for assuring a predetermined minimum loop in the parity check matrix to be finally generated, and generating a mask matrix for converting a specific cyclic permutation matrix into a zero-matrix based on the conditional expression and a predetermined weight distribution; a masking step of converting the specific cyclic permutation matrix in the regular quasi-cyclic matrix into the zero-matrix using the mask matrix to generate an irregular masking quasi-cyclic matrix; and a check-matrix generating step of generating an irregular parity check matrix with an LDGM structure in which the masking quasi-cyclic matrix, and a matrix in which the cyclic permutation matrices are arranged in a staircase manner are arranged in a predetermined location.

Effect of the Invention

According to the present invention, a predetermined masking rule for generating the irregular matrix is applied to the regular quasi-cyclic matrix in which the specific regularity is given, allowing the irregular parity check matrix with the LDGM structure to be easily generated. Moreover, it is not necessary to generate the generator matrix G as is necessary in the conventional technology, allowing the circuit scale to be greatly reduced.

BRIEF DESCRIPTION OF DRAWINGS

FIG. 2-1 is a view showing a configuration of a product-sum operation unit in code generation.

FIG. 2-2 is a view showing a configuration example of a code generating unit using the product-sum operation unit shown in FIG. 2-1.

FIG. 9-1 is a view showing a configuration example of the LDPC decoder.

FIG. 9-2 is a view showing a configuration example of the LDPC decoder.

FIG. 11-1 is a view showing a configuration example of a column processing unit that executes column processing in the "cyclic approximation min algorithm".

FIG. 11-2 is a view showing a configuration example of a column processing unit that executes column processing in the "cyclic approximation min algorithm".

FIG. 17 is a view showing an example of a parity check matrix of QC codes.

EXPLANATIONS OF LETTERS OR NUMERALS

Figure 1:
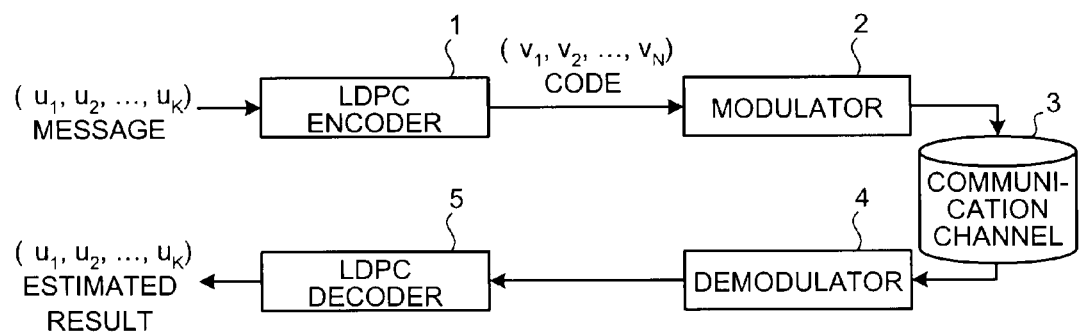
FIG. 1 is a view showing a configuration example of a communication system including an LDPC encoder and an LDPC decoder according to the present embodiment.

1 LDPC encoder
2 Modulator
3 Communication channel
4 Demodulator
5 LDPC decoder
11 Received-LLR calculation unit
12, 12a Decode core unit
21, 21a Intermediate-result storing unit
22, 22-1, 22-2, 22-G Row processing unit
23, 23-1, 23-2, 23-G Column processing unit
24 Decoded-result determining unit
25, 25a Control unit
31 Minimum-value selecting unit
32 Code operation unit
33 LLR calculation unit
41 α adder unit
42 λ adder unit
43 Minimum-k-value comparing unit
44 Code operation unit
51 Product-sum operation unit
81 Information-Packet generating unit
82 Erasure-LDPC encoding unit
83 Transmission unit
85 Reception unit 86 Erasure-LDPC decoding unit
87 Information-bit reproducing unit
100 Mobile terminal
101 Erasure-correction LDPC encoder
102 Physical-layer LDPC encoder
103 Modulator
104 Demodulator
105 Physical-layer LDPC decoder
106 Erasure-correction LDPC decoder
107, 207 Antenna
200 Base station
201 Erasure-correction LDPC decoder
202 Physical-layer LDPC decoder
203 Demodulator
204 Modulator
205 Physical-layer LDPC encoder
206 Erasure-correction LDPC encoder

BEST MODE(S) FOR CARRYING OUT THE INVENTION

Hereinafter, embodiments of a communication apparatus according to the present invention will be explained in detail based on the drawings. Incidentally, the present invention is not limited by these embodiments.

First Embodiment

FIG. 1 is a view showing a configuration example of a communication system including an LDPC encoder and an LDPC decoder according to the present embodiment. In FIG. 1, a communication apparatus (which is called a transmission apparatus) on a transmission-side has a configuration including an LDPC encoder 1 and a modulator 2, and a communication apparatus (which is called a reception apparatus) on a reception-side has a configuration including a demodulator 4 and an LDPC decoder 5.

Here, a flow of encoding processing and decoding processing in the communication system that employs LDPC codes will be explained briefly.

The LDPC encoder 1 in the transmission apparatus generates a parity check matrix generated by a check-matrix generating method according to the present embodiment, namely, a parity check matrix $H_{MQCL}$ with M-row×N-column to which masking processing is performed based on a predetermined masking rule described below.

Thereafter, the LDPC encoder 1 receives a message ($u_1$, $u_2$, ... $u_K$) with an information length K to generate a code v with a length N using this message and the parity check matrix $H_{MQCL}$ as represented by following Equation (3). It should be noted that in the present embodiment, the encoding processing of information bits is performed without using the generator matrix G (K: information length, N: code length) calculated in the conventional technology.

$$v = \{(v_1, v_2, \ldots, v_N) \in GF(2) | (v_1, v_2, \ldots, v_N) H_{MQCL}{}^T = 0\} \quad (3)$$

The modulator 2 in the transmission apparatus then digital-modulates the code v generated by the LDPC encoder 1 according to a predetermined modulation system, such as BPSK, QPSK, and multi-value QAM, and transmits the modulated signal $x=(x_1, x_2, \ldots, x_N)$ to the reception apparatus to a communication channel 3.

Meanwhile, in the reception apparatus, the demodulator 4 digital-demodulates a modulated signal $y=(y_1, y_2, \ldots, y_N)$ received via the communication channel 3 according to a modulation system, such as the BPSK, QPSK, and multi-value QAM, and the LDPC decoder 5 in the reception apparatus further performs repetition decoding with a decoding algorithm ("cyclic approximation min algorithm"), which will be explained below, to the demodulated result to thereby output the decoded result (corresponding to the original message $u_1$, $u_2$, ..., $u_K$) Here, the "cyclic approximation min algorithm" is a decoding system for performing repetition decoding using an approximate minimum value, rather than an accurate minimum value, in which only an absolute value of LLR for a minimum k value (from a minimum value to a k-th value in an ascending order) is cyclically updated.

Subsequently, the check-matrix generating method according to the present embodiment will be explained in detail. Incidentally, in the present embodiment, it is supposed that an irregular (weight distribution is nonuniform) parity check matrix is generated, and it is premised that an LDGM (low-density generation matrix) structure is employed as the structure. Moreover, check matrix generation processing of each embodiment explained hereinafter may be performed by the LDPC encoder 1 in the communication apparatus, or may be performed in advance outside the communication apparatus. When it is performed outside the communication apparatus, the generated check matrix is stored in an internal memory.

First, a parity check matrix $H_{QCL}$ of QC-LDPC codes with the LDGM structure, which is a premise for the irregular parity check matrix $H_{MQCL}$ after the masking processing and is generated by the check matrix generation processing of the present embodiment, will be defined.

For example, the parity check matrix $H_{QCL}$ ($=[h_{m,n}]$) of the QC-LDPC codes with the LDGM structure of M ($=pJ$) rows×N ($=pL+pJ$) columns can be defined as following Equation (4).

[Numerical Expression 2]

$$H_{QCL} = \begin{bmatrix} I(p_{0,0}) & I(p_{0,1}) & \ldots & I(p_{0,L-1}) & I(0) & & \\ I(p_{1,0}) & I(p_{1,2}) & \ldots & I(p_{1,L-1}) & I(0) & I(0) & \\ \vdots & \vdots & \ddots & \vdots & & \ddots & \ddots \\ I(p_{J-1,0}) & I(P_{J-1,2}) & \ldots & I(p_{J-1,L-1}) & & & I(0) & I(0) \end{bmatrix} \quad (4)$$

Here, $h_{m,n}$ represents an element at a row index m and a column index n in the parity check matrix $H_{QCL}$. Additionally, in $0 \leq j \leq J-1$ and $0 \leq l \leq L-1$, $I(p_{j,l})$ are cyclic permutation matrices in which positions of a row index: r ($0 \leq r \leq p-1$), and a column index: "$(r+p_{j,l})$mod p" are "1", and other positions are "0".

In the parity check matrix $H_{QCL}$, a left-hand side matrix (a portion corresponding to information bits) is a quasi-cyclic matrix $H_{QC}$ that is the same as the parity check matrix of QC codes shown by Equation (2), and a right-hand side matrix (a portion corresponding to parity bits) is a matrix T in which $I(0)$ are arranged in a staircase manner as shown in following Equation (5).

[Numerical Expression 3]

$$T = \begin{bmatrix} I(0) & & & \\ I(0) & I(0) & & \\ & \ddots & \ddots & \\ & & I(0) & I(0) \end{bmatrix} \quad (5)$$

However, the cyclic permutation matrices used in the staircase structure are not necessarily limited to I(0), but may be a combination of arbitrary $I(s|s \in [0, p-1])$.

Note that, the LDGM structure means a structure in which a part of the parity check matrix is formed into a lower triangular matrix as the matrix shown in Equation (4). Encoding can be achieved easily by using this structure without using the generator matrix G. For example, when the systematic code v is represented as following Equation (6), and the information message $u = (u_1, u_2, \ldots, u_K)$ is given, parity elements $p_m = (p_1, p_2, \ldots, p_M)$ are generated so that "$H_{QCL} \cdot v^T = 0K$" may be satisfied, namely as following Equation (7).

[Numerical Expression 5]

$$v = (v_1, v_2, \ldots v_K, v_{K+1}, v_{K+2}, \ldots, v_N) \qquad (6)$$
$$= (u_1, u_2, \ldots u_K, p_1, p_2, \ldots, p_M)$$

where N=K+M.

[Numerical Expression 4]

$$p_m = \sum_{n=1}^{K+m-1} v_n h_{m,n}, 1 \le m \le M, 1 \le n \le N \qquad (7)$$

Further, in the present embodiment, a specific regularity is provided in the parity check matrix $H_{QCL}$ of the QC-LDPC codes with the LDGM structure defined as Equation (4). Specifically, in the quasi-cyclic matrix portion on the left-hand side of the parity check matrix $H_{QCL}$, a specific regularity is provided in which a column index of the first row of the cyclic permutation matrices with p-row×p-column arranged at a row index j and a column index l is "$(j+c) \cdot (l+d)$". Here, c and d are arbitrary integers equal to or greater than 0, and "$(j+c) \cdot (l+d) < p$". An example of the parity check matrix $H_{QCL}$ of the QC-LDPC codes with the LDGM structure provided with the specific regularity is shown in following Equation (8). In the equation, c=0 and d=1.

$$H_{QCL} = \begin{bmatrix} I(0) & I(0) & I(0) & \ldots & I(0) & I(0) & & & \\ I(1) & (I(1))^2 & (I(1))^3 & \ldots & (I(1))^L & I(0) & I(0) & & \\ (I(1))^2 & (I(1))^4 & (I(1))^6 & \ldots & (I(1))^{2L} & & I(0) & I(0) & \\ \vdots & \vdots & \vdots & \ddots & \vdots & & & \ddots & \ddots \\ (I(1))^{J-1} & (I(1))^{(J-1) \cdot 2} & (I(1))^{(J-1) \cdot 3} & \ldots & (I(1))^{(J-1)L} & & & & I(0) & I(0) \end{bmatrix} \qquad (8)$$

$$= \begin{bmatrix} I(0) & I(0) & I(0) & \ldots & I(0) & I(0) & & & \\ I(1) & I(2) & I(3) & \ldots & I(L) & I(0) & I(0) & & \\ I(2) & I(4) & I(6) & \ldots & I(2 \cdot L) & & I(0) & I(0) & \\ \vdots & \vdots & \vdots & \ddots & \vdots & & & \ddots & \ddots \\ I(J-1) & I((J-1) \cdot 2) & I((J-1) \cdot 3) & \ldots & I((J-1) \cdot L) & & & & I(0) & I(0) \end{bmatrix}$$

Subsequently, mask processing for the parity check matrix $H_{QCL}$, which is distinctive processing in the check-matrix generating method of the present embodiment, will be explained.

For example, when the left-hand side quasi-cyclic matrix shown in Equation (8) is represented by the matrix $H_{QCLL}$ of J-row×L-column as shown in following Equation (9-1), and a mask matrix Z ($=z_{j,l}$) is defined as a matrix with J-row×L-column on GF(2), the matrix $H_{MQCLL}$ after the mask processing can be represented as following Equation (9-2) if a predetermined rule described below is applied.

[Numerical Expression 6-1]

$$H_{QCLL} = \begin{bmatrix} I(0) & I(0) & \ldots & I(0) \\ I(1) & I(2) & \ldots & I(L) \\ \vdots & \vdots & \ddots & \vdots \\ I(J-1) & I((J-1) \cdot 2) & \ldots & I((J-1) \cdot L) \end{bmatrix} \qquad (9\text{-}1)$$

[Numerical Expression 6-2]

$$H_{MQCLL} = Z \times H_{QCLL} \qquad (9\text{-}2)$$

$$= \begin{bmatrix} z_{0,0} I(0) & z_{0,1} I(0) & \ldots & z_{0,L-1} I(0) \\ z_{1,0} I(1) & z_{1,1} I(2) & \ldots & z_{1,L-1} I(L) \\ \vdots & \vdots & \ddots & \vdots \\ z_{J-1,0} I(J-1) & z_{J-1,1} I((J-1) \cdot 2) & \ldots & z_{J-1,L-1} I((J-1) \cdot L) \end{bmatrix}$$

Here, $z_{j,l} I(p_{j,l})$ in Equation (9-2) is defined as following Equation (10).

[Numerical Expression 7]

$$z_{j,l} I(p_{j,l}) = \begin{cases} I(p_{j,l}) & \text{for } z_{j,l} = 1 \\ \text{Zero} - \text{matrix} & \text{for } z_{j,l} = 0 \end{cases} \qquad (10)$$

The aforementioned zero-matrix is a zero-matrix with p-row×p-column. Additionally, the matrix $H_{MQCLL}$ is a matrix in which the quasi-cyclic matrix $H_{QCLL}$ is masked with 0-elements of the mask matrix Z, and the weight distribution is un-uniform (irregular). Note that a weight distribution of the mask matrix Z when the weight distribution is un-uniform shall be determined by a known density evolution method or the like.

Hence, the irregular parity check matrix $H_{MQCL}$ to be finally determined in the present embodiment can be represented as following Equation (11).

$$H_{MQCL} = [Z \times H_{QCLL} | H_T] \quad (11)$$
$$= [H_{MQCLL} | H_T]$$

Subsequently, an implementation example when the encoding is achieved using the regular parity check matrix $H_{MQCL}$ without using the generator matrix G will be shown hereinafter, and an operation thereof will be explained. Note herein that, the parity check matrix $H_{QCL}$ of the QC-LDPC codes with the LDGM structure is considered as a matrix shown in following Equation (12-1).

[Numerical Expression 8-1]

$$H_{QCL} = \begin{bmatrix} I(0) & I(0) & I(0) & 0 & 0 \\ I(1) & I(2) & I(0) & I(0) & 0 \\ I(2) & I(4) & 0 & I(0) & I(0) \end{bmatrix}, p = 5 \quad (12\text{-}1)$$

Meanwhile, the irregular parity check matrix $H_{MQCL}$ in which the matrix shown in Equation (12-1) is masked is defined as a matrix shown in following Equation (12-2).

[Numerical Expression 8-2]

$$H_{MQCL} = \begin{bmatrix} I(0) & I(0) & I(0) & 0 & 0 \\ I(1) & 0 & I(0) & I(0) & 0 \\ 0 & I(4) & 0 & I(0) & I(0) \end{bmatrix} \quad (12\text{-}2)$$

Additionally, the information message is defined as $u = (u_{p,1} u_{p,2}) = (01100\ 11001)$. Note that $u_{p,l}$ is provided by dividing u for every p bits to then give numbers in an ascending order to 1.

Here, as processing in generating codes without using the generator matrix G, a product-sum operation of the matrix $H_{MQCLL}$ after the mask processing for p rows and the information message u will be explained.

Figures 1, 2:
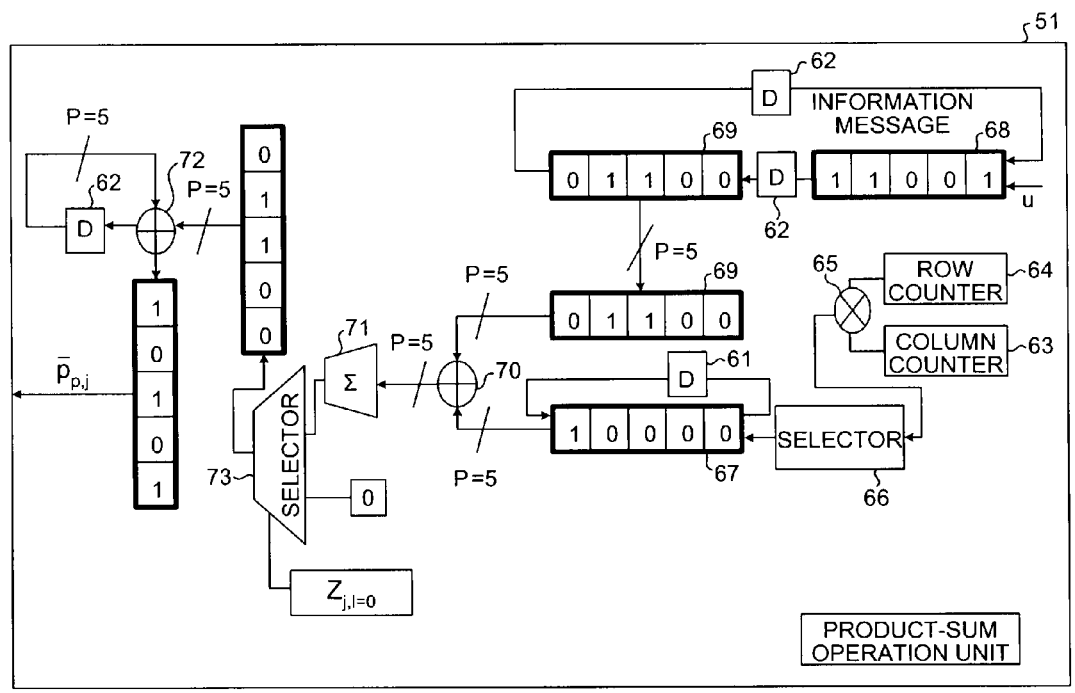
Figure 2:
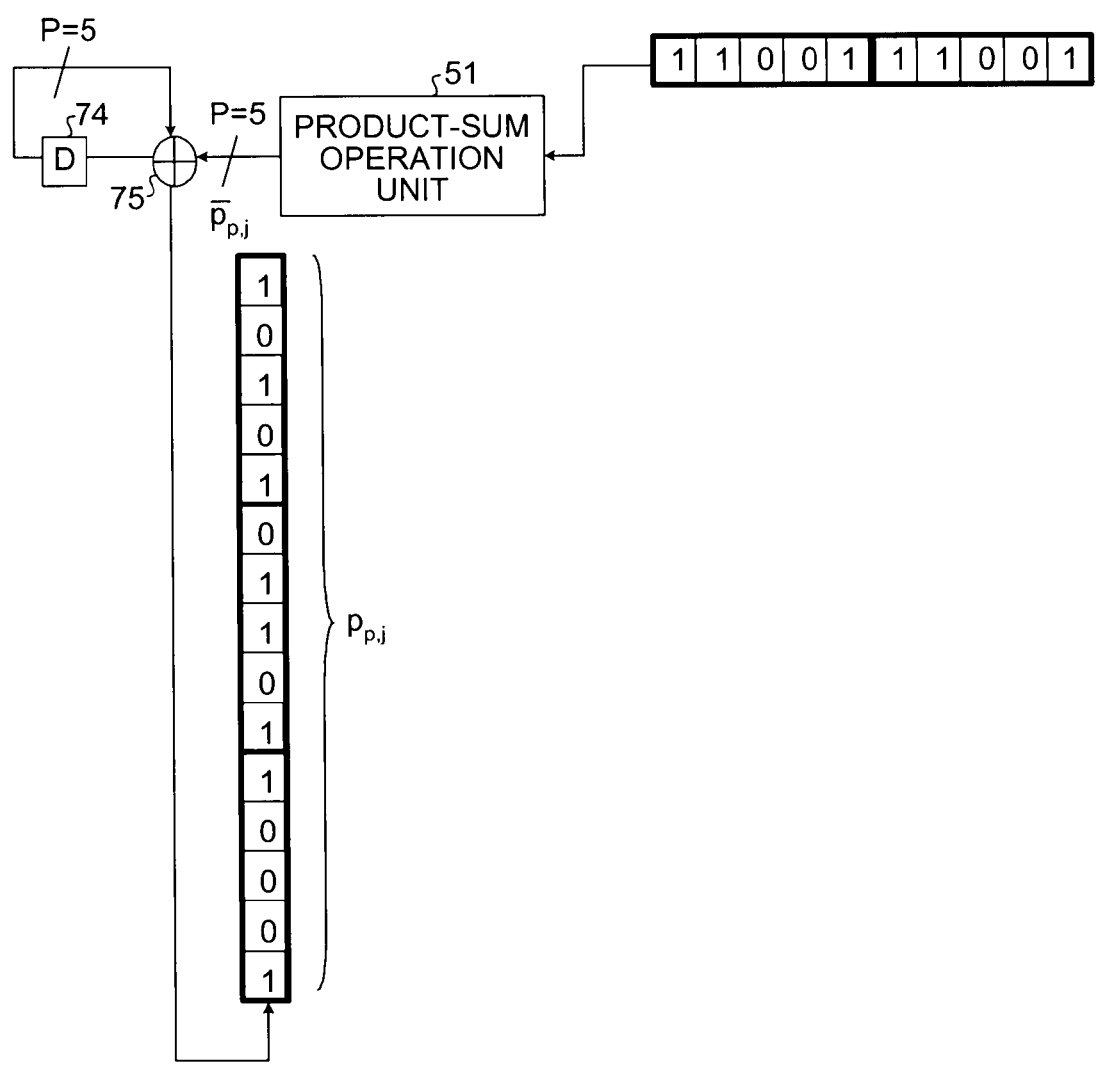

FIG. 2-1 is a view showing a configuration of a product-sum operation unit 51 in code generation. Here, a reference clock is set to 1 clock, and in the figure, a delay element (D) 61 operates per 1 clock cycle, a delay element (D) 62 operates per p clock cycles (in this example, P=5). Additionally, a column counter 63 operates per p clock cycles, and a row counter 64 operates per L·p clock cycles (in this example, L=2).

Since the cyclic permutation matrix at the j-th row and l-th column of the quasi-cyclic matrix $H_{QCLL}$ is $I(j \cdot (l+1))$, "$0 \leq j \leq J-1$", "$0 \leq l \leq L-1$" in FIG. 2-1, j is counted per L·p clock cycles in an ascending order by the row counter 64, "l+1" is counted per p clock cycles in an ascending order by the column counter 63, "j·(l+1)" is calculated by a multiplier 65, the calculated value is inputted into a selector 66, and a position of "1" of a register 67 with length p is decided, so that a position of "1" of the first row of the cyclic permutation matrix at the j-th row and l-th column is set.

Meanwhile, as for the information message u, it is divided for every p-length to be then inputted into registers 68 and 69 in order via the delay element 62 per p clock cycles. EXOR between the information message u with length p in the register 69, and a bit string in the register 67 is then calculated by the adder 70, and a summation of each bit of EXOR operation results is calculated by an adder 72. A sum-product calculation between the first row of $I(j \cdot (l+1))$ and $u_{p,l}$ of the information message can be achieved by this processing. Next, the second row of $I(j \cdot (l+1))$ can be generated by shifting the register 67 using the delay element 61, thus a sum-product calculation between the second row of $I(j \cdot (l+1))$ and $u_{p,l}$ of the information message can be similarly achieved. Thereafter, sum-product calculation results $p_{p,j}'$ for p rows of $I(j \cdot (l+1))$ can be obtained by repeatedly executing this processing p times. Incidentally, $p_{p,j}'$ means p bits of the sum-product calculation results of all the cyclic permutation matrices at the j-th row.

Next, to calculate the product-sum between $I(j \cdot (l+1))$ and $u_{p,l}$ from l=0 to l=L-1, the EXOR operation is repeatedly performed L times by the delay element 62 and the adder 72. This operation is repeatedly executed from j=0 to j=J-1, so that a sum-product calculation result $p_{p,j}'$ between the matrix $H_{MQCLL}$ after the mask processing and u is obtained. Incidentally, in the selector 73, 0 is selectively outputted when $z_{j,l}=0$, and an output of an adder 71 is selectively outputted when $z_{j,l}=1$.

Meanwhile, FIG. 2-2 is a view showing a configuration example of a code generating unit using the product-sum operation unit 51 shown in FIG. 2-1. Here, a delay element (D) 74 operates per L·p clock cycles. In FIG. 2-2, supposing that a sequence (parity bits) in which a number is given to j for every p bits in an ascending order is $p_{p,j}$ the sequence $p_{p,j}$ is obtained by the EXOR operation by the delay element 74 and an adder 75. Namely, "$p_{p,j}=p_{p,j}' \cdot p_{p,j}$" are calculated, where $p_{p,0}'=0$.

Subsequently, the masking rule when the aforementioned quasi-cyclic matrix $H_{QCLL}$ is masked with the 0-elements of the mask matrix Z will be specifically explained. Here, the mask matrix Z for making the quasi-cyclic matrix $H_{QCLL}$ irregular is generated based on the regular masking rule.

In the present embodiment, when a minimum loop of the matrix $H_{MQCLL}$ after being masked is 8, for example, a conditional expression in which the quasi-cyclic matrix $H_{QCLL}$ shown in Equation (9-1) includes loop 6 is derived as the masking rule. Here, it is already known that the minimum loop (internal diameter) in the quasi-cyclic matrix $H_{QCLL}$ of Equation (9-1) is 6.

For example, when six cyclic permutation matrices $I(p_{j1,l1})$, $I(p_{j2,l1})$, $I(p_{j2,l2})$, $I(p_{j3,l2})$, $I(p_{j3,l3})$, and $I(p_{j1,l3})$ shown in Equation (2) satisfy following Equation (13), there is the loop 6 between these six cyclic permutation matrices. Here, "j1, j2, j3 $\in$ [0, J-1]" and "l1, l2, l3 $\in$ [0, L-1]".

[Numerical Expression 9]

$$(p_{j1,l1} - p_{j2,l1}) + (p_{j2,l2} - p_{j3,l3}) + (p_{j3,l3} - p_{j3,l3}) = 0 \quad (13)$$

Here, a case in which the conditional expression of Equation (13) is applied to the quasi-cyclic matrix $H_{QCLL}$ shown in Equation (9-1) will be explained.

For example, in the quasi-cyclic matrix $H_{QCLL}$ shown in Equation (9-1), the cyclic permutation matrix at a-th row and b-th column is represented as I(ab), and the cyclic permutation matrix at jd-th row and ld-th column, relatively counted from I(ab), is represented as I((a+jd) (b+ld)). At this time, $I(p_{a+jd, b+ld})$ in Equation (2) corresponds to I((a+jd)(b+ld)) in Equation (9-1). Additionally, the aforementioned six cyclic permutation matrices are represented as I(ab), I((a+jd1)b), I((a+jd1)(b+ld1)), I((a+jd2)(b+ld1)), I((a+jd2)(b+ld2)), and I(a(b+ld2)).

Hence, by applying the conditional expression represented by Equation (13) to the six cyclic permutation matrices in Equation (9-1), following Equation (14-1) can be derived as the masking rule.

[Numerical Expression 10-1]

$$\{ab - (a+jd1) \cdot b\} - \{(a+jd1)(b+ld1) - (a+jd2)(b+ld1)\} + \\ \{(a+jd2)(b+ld2) - a(b+ld2)\} = \\ ab - ab - b \cdot jd1 + ab + a \cdot ld1 + b \cdot jd1 + jd1 \cdot ld1 - \\ ab - a \cdot ld1 - b \cdot jd2 - jd2 \cdot ld1 + ab + \\ a \cdot ld2 + b \cdot jd2 + jd2 \cdot ld2 - ab - a \cdot ld2 = \\ jd1 \cdot ld1 - jd2 \cdot ld1 + jd2 \cdot ld2 = jd1 \cdot ld1 + (ld2 - ld1)jd2 = 0 \quad (14\text{-}1)$$

Here, when there is "(j+c)·(l+d)≧p", the column index "1" of the first row of the cyclic permutation matrix with p-row× p-column arranged at the row index j and the column index l in the quasi-cyclic code $H_{QCLL}$ is "(j+c)·(l+d)mod p". In this case, Equation (14-1) becomes following Equation (14-2).

[Numerical Expression 10-2]

$$(jd1 \cdot ld1 + (ld2 - ld1) \cdot jd2) \bmod p = 0 \quad (14\text{-}2)$$

In the present embodiment, the mask matrix Z is configured under the condition that it does not satisfy Equation (14-1) or Equation (14-2). This can assure that the minimum loop of the matrix $H_{MQCLL}$ after being masked is 8. Additionally, detection processing of the loop 6 using the conditional expression with a limited small size is allowed by deriving Equation (14-1) or Equation (14-2), which facilitates detection of the loop 6. Below, Equation (14-1) or Equation (14-2) is simply represented as Equation (14).

Figure 3:
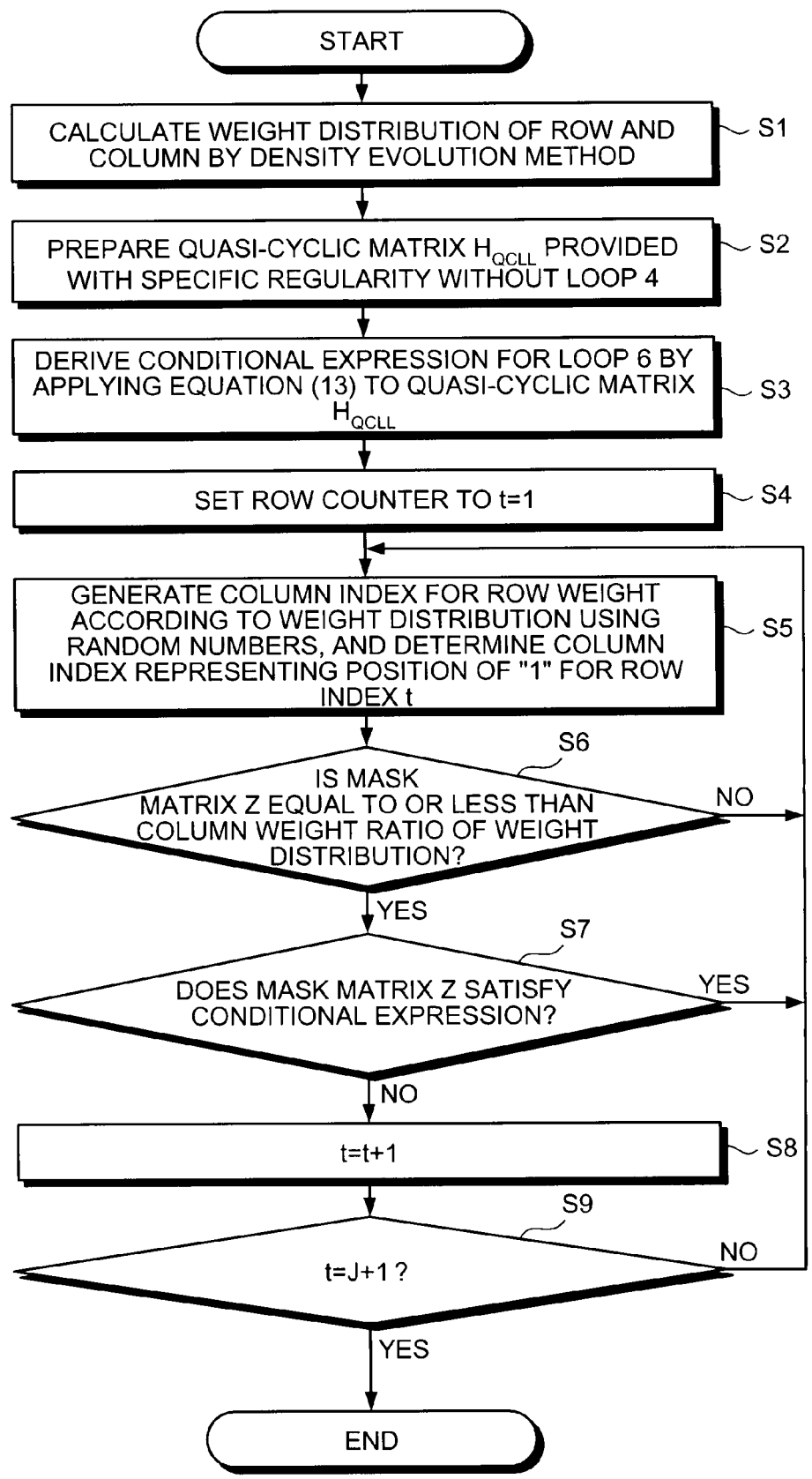
FIG. 3 is a flowchart showing mask-matrix generation processing.

Subsequently, mask matrix generation processing based on the masking rule performed by the communication apparatus according to the present embodiment will be specifically explained. FIG. 3 is a flowchart showing the mask matrix generation processing according to the present embodiment. Note herein that an example when the mask matrix generation processing according to the present embodiment is performed by the LDPC encoder unit 1 in the communication apparatus is shown.

First, the weight distribution of the rows and the columns of the mask matrix Z is calculated by the LDPC encoder 1 in the communication apparatus using the density evolution method (Step S1). Although the common density evolution method requires long time to calculate an optimum value of the weight distribution because a vast number of combinations of the rows and the columns of the entire check matrix H is calculated to determine the weight distribution, the processing according to the present embodiment performs the density evolution method only for the mask matrix, thus the number of combinations is reduced and the weight distribution can be derived in very short time. Additionally, the LDPC encoder 1 prepares the quasi-cyclic matrix $H_{QCLL}$ shown in Equation (9-1), for example, as a quasi-cyclic matrix provided with a specific regularity without loop 4 (Step S2).

Next, the LDPC encoder 1 applies the conditional expression represented as Equation (13) to the aforementioned quasi-cyclic matrix $H_{QCLL}$ and derives the conditional expression shown in Equation (14) in which the quasi-cyclic matrix $H_{QCLL}$ includes the loop 6 (Step S3).

Next, the LDPC encoder 1 sets a row counter in the mask matrix Z to t=1 (Step S4), and generates the column index for a row weight using random numbers based on the weight distribution calculated at Step S1 to set this column index as a position of "1" for the row index t=1 (Step S5). At this time, it is determined whether the weight of each column of the mask matrix Z generated until then is equal to or less than a column weight number calculated at Step S1 (Step S6). If it is equal to or less than a specified column weight number (Step S6, Yes), the processing proceeds to the next step, while if there is the column of which the weight exceeds the specified column weight number (Step S6, No), the processing at Steps S5 and S6 is repeated until all the column weights become equal to or less than the specified column weight number.

Thereafter, when all the column weights become equal to or less than the specified column weight in the processing at Step S6, the LDPC encoder 1 determines whether the mask matrix Z generated until then satisfies the conditional expression derived at Step S3 (Step S7). If it does not satisfy the conditional expression (Step S7, No), the processing proceeds to the next step, while if it satisfies (Step S7, Yes), the processing at Steps S5, S6, and S7 is repeated until all the column weights become equal to or less than the specified column weight number and the conditional expression becomes not satisfied.

When the conditional expression becomes not satisfied in the processing at Step S7, the LDPC encoder 1 increments the column counter t in the mask matrix Z (Step S8), and further repeats the processing at Steps S5 to S9 until the column counter t is incremented to J+1 (Step S9) to finally output the mask matrix Z with J-row×L-column.

It should be noted that, while the processing at Step S3 is to derive the conditional expression for the loop 6 in the present embodiment, it is not limited thereto, and the conditional expressions for loop 8, loop 10, . . . , might be further derived to add these conditional expressions as a determination condition at Step S7. Since the mask matrix that can avoid all the conditions, such as the loop 6 or the like, cannot be necessarily detected, particularly when the mask matrix is small, the conditions to avoid the loop 6 or the like may be sequentially excluded for greater column weight numbers in a descending order. Such a procedure is effective because performance degradation may not occur, even when there is a short loop due to a path to a check node partially connected to a bit node with a large column weight, if the loop configured by the check node connected to other nodes is large.

As is understood, in the present embodiment, a specific regularity that the column index of the first row of the cyclic permutation matrix arranged at the row index j and the column index l in the quasi-cyclic matrix $H_{QC}$ portion becomes "(j+c)·(l+d)" is provided to the parity check matrix $H_{QCL}$ of the QC-LDPC codes with the LDGM structure, and a predetermined masking rule is applied to the quasi-cyclic matrix $H_{QCLL}$ to which the specific regularity is provided for generating an irregular matrix. Specifically, the minimum loop of the matrix $H_{MQCLL}$ after being masked is set to 8 by deriving the conditional expression in which the quasi-cyclic matrix $H_{QCLL}$ includes the loop 6 and configuring the mask matrix Z under the condition that it does not satisfy this conditional expression. As a result of this, the irregular parity check matrix $H_{MQCL}$ with the LDGM structure can be generated from the regular parity check matrix $H_{QCL}$ with the LDGM structure. Moreover, encoding can be achieved easily without using the generator matrix G as a result of forming a part of the parity check matrix into the stepwise structure, and thus allowing the circuit scale to be greatly reduced since it is not necessary to generate the generator matrix G as necessary in the conventional technology.

Second Embodiment

In the first embodiment, the known specific regularity is provided in the parity check matrix $H_{QCL}$ of the QC-LDPC codes with the LDGM structure defined as Equation (4), in which the column index "1" of the first row of the cyclic permutation matrix with p-row×p-column arranged at the row index j and the column index l in the quasi-cyclic matrix $H_{QCL}$ portion on the left-hand side of the parity check matrix $H_{QCL}$ is "(j+c) (l+d)" (see Equation (8)). However, the specific regularity is not limited to that explained above as long as constant encoding/decoding performance is achieved. Accordingly, in a second embodiment, regularity other than that explained in the first embodiment is proposed. In the present embodiment, processing different from that explained in the first embodiment is explained.

In the present embodiment, a specific regularity different from that in the first embodiment is provided in the parity check matrix $H_{QCL}$ of the QC-LDPC codes with the LDGM structure defined as Equation (4). Specifically, to the quasi-cyclic matrix portion on the left-hand side of the parity check matrix $H_{QCL}$, a regularity is provided in which the column index "1" of the first row of the cyclic permutation matrix with p-row×p-column arranged at the row index j and the column index l is "$q^{(j+c)} \cdot q^{(l+d)}$". Here, q is a positive integer, c and d are arbitrary integers equal to or greater than 0, which satisfy "$q^{(j+c)} \cdot q^{(l+d)} < p$". An example of the parity check matrix $H_{QCL}$ of the QC-LDPC codes with the LDGM structure according to the present embodiment provided with the specific regularity is shown in following Equation (15). In the equation, q=2, c=1, and d=0.

[Numerical Expression 11]

$$H_{QCL} = \begin{bmatrix} I(2^{(0+0)}) & I(2^{(0+1)}) & I(2^{(0+2)}) & \ldots & I(2^{(0+L-1)}) & I(0) & & & \\ I(2^{(1-0)}) & I(2^{(1+1)}) & I(2^{(1+2)}) & \ldots & I(2^{(1+L-1)}) & I(0) & I(0) & & \\ I(2^{(2+0)}) & I(2^{(2+1)}) & I(2^{(2+2)}) & \ldots & I(2^{(2+L-1)}) & & I(0) & I(0) & \\ \vdots & \vdots & \vdots & \ddots & \vdots & & & \ddots & \ddots \\ I(2^{(J-1+0)}) & I(2^{(J-1+1)}) & I(2^{(J-1+2)}) & \ldots & I(2^{(J-1+L-1)}) & & & & I(0) & I(0) \end{bmatrix} \quad (15)$$

Subsequently, mask processing for the parity check matrix $H_{QCL}$, which is distinctive processing in the check-matrix generating method of the present embodiment, will be explained.

For example, when the left-hand side quasi-cyclic matrix shown in Equation (15) is represented by the matrix $H_{QCLL}$ of J-row×L-column as shown in following Equation (16), and a mask matrix Z (=$[z_{j,l}]$) is defined as a matrix with J-row×L-column on GF(2), the matrix $H_{MQCLL}$ after the mask processing can be represented as following Equation (17) and Equation (18) if a predetermined rule described below is applied.

[Numerical Expression 12]

$$H_{QCLL} = \begin{bmatrix} I(1) & I(2) & \ldots & I(2^{(L-1)}) \\ I(2) & I(2^2) & \ldots & I(2^L) \\ \vdots & \vdots & \ddots & \vdots \\ I(2^{(J-1)}) & I(2^{(J)}) & \ldots & I(2^{(J+L-2)}) \end{bmatrix} \quad (16)$$

[Numerical Expression 13]

$$H_{MQCLL} = Z \times H_{QCLL} \quad (17)$$

$$= \begin{bmatrix} z_{0,0}I(1) & z_{0,1}I(2) & \ldots & z_{0,L-1}I(2^{(L-1)}) \\ z_{1,0}I(2) & z_{1,1}I(2^2) & \ldots & z_{1,L-1}I(2^L) \\ \vdots & \vdots & \ddots & \vdots \\ z_{J-1,0}I(2^{(J-1)}) & z_{J-1,1}I(2^{(J)}) & \ldots & z_{J-1,L-1}I(2^{(J+L-2)}) \end{bmatrix}$$

[Numerical Expression 14]

$$z_{j,l}I(p_{j,l}) = \begin{cases} I(p_{j,l}) & \text{for } z_{j,l} = 1 \\ \text{Zero} - \text{matrix} & \text{for } z_{j,l} = 0 \end{cases} \quad (18)$$

Here, in the present embodiment, the irregular parity check matrix $H_{MQCL}$ to be finally determined can be represented as Equation (11) as explained hereinabove.

Subsequently, the masking rule when the aforementioned quasi-cyclic matrix $H_{QCLL}$ is masked with the 0-elements of the mask matrix Z will be specifically explained. Here, the mask matrix Z is generated based on the regular masking rule as explained hereinabove.

In the present embodiment, when the minimum loop of the masked matrix $H_{MQCLL}$ is 8, for example, the conditional expression in which the quasi-cyclic matrix $H_{QCLL}$ shown in Equation (16) includes the loop 6 is derived as the masking rule. Here, it is already known that the minimum loop (internal diameter) in the quasi-cyclic matrix $H_{QCLL}$ of Equation (16) is 6. Also in the present embodiment, when six cyclic permutation matrices $I(p_{j1,l1})$, $I(p_{j2,l1})$, $I(p_{j2,l2})$, $I(p_{j3,l2})$, $I(p_{j3,l3})$, and $I(p_{j1,l3})$ shown in Equation (2) satisfy Equation (13), there is the loop 6 between these six cyclic permutation matrices.

Here, a case in which the conditional expression of Equation (13) is applied to the six cyclic permutation matrices of the quasi-cyclic matrix $H_{QCLL}$ shown in Equation (16) will be explained.

For example, in the quasi-cyclic matrix $H_{QCLL}$ shown in Equation (16), the cyclic permutation matrix at a-th row and b-th column is represented as $I(q^{ab})$, and the cyclic permutation matrix at jd-th row and ld-th column, relatively counted from $I(q^{ab})$, is represented as $I(q^{(a+jd)(b+ld)})$. At this time, $I_{(pa+jd,\ b+ld)}$ in Equation (2) corresponds to $I(q^{(a+jd)(b+ld)})$ in Equation (16). Additionally, the aforementioned six cyclic permutation matrices are represented as $I(q^{ab})$, $I(q^{(a+jd1+b)})$ $I(q^{(a+jd1+b+ld1)})$, $I(q^{(a+jd2+b+ld1)})$, $I(q^{(a+jd2+b+ld2)})$ and $I(q^{(a+b+ld2)})$.

Hence, by applying the conditional expression represented by Equation (13) to the six cyclic permutation matrices in Equation (16), following Equation (19-1) can be derived as the masking rule.

[Numerical Expression 15-1]

$$\{q^{a+b}-q^{a+jd1-b}\}+\{q^{a+jd1+b+ld1}-q^{a+jd2+b-ld1}\}+\{q^{a+jd2+b-ld2}-q^{a+ld2}\}=0$$

$$1-q^{jd1}+q^{jd1+ld1}-q^{jd2+ld1}+q^{jd2+ld2}-q^{ld2}=0 \quad (19\text{-}1)$$

Here, when there is "$q^{(j+c)}\cdot q^{(l+d)}\geq p$", the column index "1" of the first row of the cyclic permutation matrix with p-row× p-column arranged at the row index j and the column index 1 in the quasi-cyclic code $H_{QCLL}$ is "$q^{(j+c)}\cdot q^{(l+d)}$ mod p". In this case, Equation (19-1) becomes following Equation (19-2).

[Numerical Expression 15-2]

$$(1-q^{jd1}+q^{jd1+jd1}-q^{jd2+jd1}+q^{jd2+jd2}-q^{jd2})\bmod p=0 \quad (19\text{-}2)$$

In the present embodiment, the mask matrix Z is configured under the condition that it does not satisfy Equation (19-1) or Equation (19-2). This can assure that the minimum loop is 8. Additionally, detection processing of the loop 6 using the conditional expression with a limited small size is allowed by deriving Equation (19-1) or Equation (19-2), which facilitates detection of the loop 6. Below, Equation (19-1) or Equation (19-2) is simply represented as Equation (19).

Although the mask matrix generation processing according to the present embodiment is basically similar to that shown in the flowchart of the first embodiment in FIG. 3, the quasi-cyclic matrix $H_{QCLL}$ prepared at Step S2 is different therefrom.

As is understood, in the present embodiment, a specific regularity that the column index of the first row of the cyclic permutation matrix arranged at the row index j and the column index 1 in the quasi-cyclic matrix $H_{QC}$ portion becomes "$q^{(j+c)}\cdot q^{(l+d)}$ mod p" is provided to the parity check matrix $H_{QCL}$ of the QC-LDPC codes with the LDGM structure, and a predetermined masking rule is applied to the quasi-cyclic matrix $H_{QCLL}$ to which the specific regularity is provided for generating an irregular matrix. Specifically, the minimum loop of the matrix $H_{MQCLL}$ after being masked is set to 8 by deriving the conditional expression in which the quasi-cyclic matrix $H_{QCLL}$ includes the loop 6 and configuring the mask matrix Z under the condition that it does not satisfy this conditional expression. As a result of this, the irregular parity check matrix $H_{MQCL}$ with the LDGM structure can be generated from the regular parity check matrix $H_{QCL}$ with the LDGM structure. Moreover, it is not necessary to generate the generator matrix G as necessary in the conventional technology, allowing the circuit scale to be greatly reduced.

Third Embodiment

While the first embodiment specifies the masking rule in a case that the minimum loop of the matrix $H_{MQCLL}$ after being masked (see Equation (9-2)) is 8 (it does not include the matrix T), for example, the irregular parity check matrix $H_{MQCL}$ finally determined by applying the aforementioned masking rule may include the loop 6 because the parity check matrix $H_{QCL}$ of the QC-LDPC codes with the LDGM structure to which the specific regularity is provided shown in Equation (8) is configured by the quasi-cyclic matrix $H_{QCLL}$ portion and the matrix T portion. Accordingly, in a third embodiment, the loop 6 is excluded from the finally determined irregular parity check matrix $H_{MQCL}$ by specifying the masking rule in which the matrix T portion is also considered. Below, the processing that is different from that of the first embodiment will be explained.

In the present embodiment, since the parity check matrix $H_{QCL}$ shown in Equation (8) is configured by the quasi-cyclic matrix $H_{QCLL}$ portion and the matrix T portion, a condition for the loop 6 to be configured between the quasi-cyclic matrix $H_{QCLL}$ and the matrix T is derived in addition to the condition derived in the first embodiment.

For example, a condition that the loop 6 is generated between the matrix T and the quasi-cyclic matrix $H_{QCLL}$ is a case that the aforementioned six cyclic permutation matrices include successive I(0)s in a vertical direction (row direction) in the matrix T. Accordingly, the six cyclic permutation matrices in the parity check matrix $H_{QCL}$ can be represented as I(0), I(0), I(ab), I((a±1)b), I((a+1)(b+ld1)), and I((a+jd2)(b+ld1)). Here, the first two I(0)s correspond to a-th and (a+1)-th rows or (a−1)-th and a-th rows.

Hence, by applying the conditional expression represented by Equation (13) to the six cyclic permutation matrices, following Equation (20-1) can be derived as the masking rule.

[Numerical Expression 16-1]

$$(0-0)+\{ab-(a+jd1)\cdot b\}+ \quad (20\text{-}1)$$
$$\{(a+jd1)(b+ld1)-(a\pm 1)(b+ld1)\}=$$
$$ab-ab-b\cdot jd1+ab+a\cdot ld1+b\cdot jd1+jd1\cdot ld1-ab-$$
$$a\cdot ld1 \mp b \mp ld1 = jd1\cdot ld1 \mp b \mp ld1 = (jd1 \mp 1)ld1 \mp b = 0$$

Here, when there is "$(j+c)\cdot(l+d)\geq p$", Equation (20-1) becomes following Equation (20-2).

[Numerical Expression 16-2]

$$((jd1\mp 1)jd1\mp b)\bmod p=0 \quad (20\text{-}2)$$

In the present embodiment, the mask matrix Z is configured under the condition that it does not satisfy Equation (14) as well as Equation (20-1) or Equation (20-2). This can assure that the minimum loop of the parity check matrix $H_{MQCL}$ after being masked is 8. Below, Equation (20-1) or Equation (20-2) is simply represented as Equation (20).

Although the mask matrix generation processing according to the present embodiment is basically similar to that shown in the flowchart of the first embodiment in FIG. 3, processing that the conditional expression in which the masked parity check matrix $H_{MQCL}$ includes the loop 6 (Equation (14) and Equation (20)) is derived at Step S3 is different therefrom.

As is understood, in the present embodiment, in addition to the processing of the first embodiment, the condition for the loop 6 configured between the quasi-cyclic matrix $H_{QCLL}$ and the matrix T is further derived because the parity check matrix $H_{QCL}$ is configured by the quasi-cyclic matrix $H_{QCLL}$ portion and the matrix T portion. This can assure that the minimum loop of the parity check matrix $H_{MQCL}$ to be finally determined is 8.

Fourth Embodiment

In the first embodiment, the masking rule is specified in the case that the minimum loop of the matrix $H_{MQCLL}$ after being masked (see Equation (9-2)) is 8 (it does not include the matrix T), for example. Moreover, in the third embodiment, the masking rule is specified in the case that the minimum loop of the parity check matrix $H_{MQCL}$ after being masked is 8 (it includes the matrix T), for example. However, the minimum loop after the masking is not limited to the loop 8, and it may be loop 10, loop 12, ..., or the like. Accordingly, a fourth embodiment specifies the masking rule in a case that the minimum loop of the matrix $H_{MQCLL}$ after being masked (see Equation (9-2)) is 10, as an example. Below, the processing that is different from that of the first embodiment will be explained.

In the present embodiment, when the minimum loop of the matrix $H_{MQCLL}$ is 10, for example, the conditional expression in which the quasi-cyclic matrix $H_{QCLL}$ shown in Equation (9-1) includes the loop 6 and the loop 8 is derived. Since the conditional expression for the loop 6 is similar to Equation (13), a conditional expression for the loop 8 is described below.

For example, when eight cyclic permutation matrices $I(p_{j1,l1})$, $I(p_{j2,l1})$, $I(p_{j2,l2})$, $I(p_{j3,l2})$, $I(p_{j3,l3})$, $I(p_{j4,l3})$, $I(p_{j4,l4})$, and $I(p_{j1,l4})$ shown in Equation (2) satisfy following Equation (21), there is the loop 8 between these eight cyclic permutation matrices. Here, "j1, j2, j3, j4∈[0, J−1]" and "l1, l2, l3, l4∈[0, L−1]".

[Numerical Expression 17]

$$(p_{j_1,l_1} - p_{j_2,l_2}) + (p_{j_3,l_3} - p_{j_3,l_2}) + (p_{j_4,l_4} - p_{j_4,l_4}) + (p_{j_4,l_4} - p_{j_4,l_4}) = 0 \quad (21)$$

Here, a case in which the conditional expression of Equation (21) is applied to the quasi-cyclic matrix $H_{QCLL}$ shown in Equation (9-1) will be explained.

For example, the aforementioned eight cyclic permutation matrices can be represented as $I(ab)$, $I((a+jd1)b)$, $I((a+jd1)(b+ld1))$, $I((a+jd2)(b+ld1))$, $I((a+jd2)(b+ld2))$, $I((a+jd3)(b+ld2))$, $I((a+jd3)(b+ld3))$, and $I(a(b+ld3))$.

Hence, by applying the conditional expression represented by Equation (21) to the eight cyclic permutation matrices in Equation (9-1), following Equation (22-1) can be derived as the masking rule.

[Numerical Expression 18-1]

$$\begin{aligned}
\{ab - (a + jd1) \cdot b\} + \{(a + jd1)(b + ld1) - (a + jd2)(b + ld1)\} + \\
\{(a + jd2)(b + ld2) - (a + jd3)(b + ld2)\} + \\
\{(a + jd3)(b + ld3) - a(b + ld3)\} = \\
ab - ab - b \cdot jd1 + ab + a \cdot ld1 + b \cdot jd1 + jd1 \cdot ld1 - \\
ab - a \cdot ld1 - b \cdot jd2 - jd2 \cdot ld1 + ab + a \cdot ld2 + \\
b \cdot jd2 + jd2 \cdot ld2 - ab - a \cdot ld2 - b \cdot jd3 - jd3 \cdot ld2 + \\
ab + a \cdot ld3 + b \cdot jd3 + jd3 \cdot ld3 - ab - a \cdot ld3 = \\
jd1 \cdot ld1 - jd2 \cdot ld1 + jd2 \cdot ld2 - jd3 \cdot ld2 + jd3 \cdot ld3 = \\
jd1 \cdot ld1 + (ld2 - ld1)jd2 + (ld3 - ld2)jd3 = 0
\end{aligned} \quad (22\text{-}1)$$

Here, when there is "(j+c)·(l+d)≧p", the column index "l" of the first row of the cyclic permutation matrix with p-row× p-column arranged at the row index j and the column index l in the quasi-cyclic code $H_{QCLL}$ is "(j+c)·(l+d)mod p". In this case, Equation (22-1) becomes following Equation (22-2).

[Numerical Expression 18-2]

$$(l d1 \cdot jd1 + (jd2 - jd1)ld2 + (jd3 - jd2)ld3) \bmod p = 0 \quad (22\text{-}2)$$

In the present embodiment, for example, the mask matrix Z is configured under the condition that it does not satisfy Equation (14) as well as Equation (22-1) or Equation (22-2).

This can assure that the minimum loop of the masked matrix $H_{MQCLL}$ is 10. Below, Equation (22-1) or Equation (22-2) is simply represented as Equation (22). Although the present embodiment assures that the minimum loop of the matrix $H_{MQCLL}$ after being masked is 10, it may assure that the minimum loop of the matrix $H_{MQCLL}$ after being masked is 8 or 10 by arbitrarily switching between a condition in which Equation (14) is not satisfied and a condition in which Equation (14) and Equation (22) are not satisfied according to a status of a transmission line or the like. It may also assure that the minimum loop of the matrix $H_{MQCLL}$ after being masked is 8, 10, 12, ..., by determining the conditional expression for the loop 10, the loop 12, ..., or the like.

Although the mask matrix generation processing according to the present embodiment is basically similar to that shown in the flowchart of the first embodiment in FIG. 3, processing that the conditional expression in which the matrix $H_{MQCLL}$ after being masked includes the loop 6, the loop 8, ..., is derived at Step S3 is different therefrom.

As is understood, in the present embodiment, the minimum loop of the matrix $H_{MQCLL}$ after being masked is adaptively changed according to the status of the communication line or the like. This allows the optimum encoding/decoding processing according to the status of the communication line or the like.

Fifth Embodiment

While the fourth embodiment derives the conditional expression for the loop 8 of the matrix $H_{MQCLL}$ after being masked (see Equation (9-2)), for example, the irregular parity check matrix $H_{MQCL}$ finally determined by applying the masking rule shown in the fourth embodiment may include loop 8 because the parity check matrix $H_{QCL}$ of the QC-LDPC codes with the LDGM structure to which the specific regularity is provided shown in Equation (8) is configured by the quasi-cyclic matrix $H_{QCLL}$ portion and the matrix T portion. Accordingly, in a fifth embodiment, loop 8 is excluded from the finally determined irregular parity check matrix $H_{MQCL}$ by specifying the masking rule in which the matrix T portion is also considered in deriving the conditional expression for the loop 8. Below, the processing that is different from that of the fourth embodiment will be explained.

In the present embodiment, since the parity check matrix $H_{QCL}$ shown in Equation (8) is configured by the quasi-cyclic matrix $H_{QCLL}$ portion and the matrix T portion, a condition for the loop 8 to be configured between the quasi-cyclic matrix $H_{QCLL}$ and the matrix T is derived in addition to the condition derived in the fourth embodiment (including the conditions derived in the first and the third embodiments).

For example, a condition that the loop 8 is generated between the matrix T and the quasi-cyclic matrix $H_{QCLL}$ is a case that the aforementioned eight cyclic permutation matrices include successive I(0)s in the vertical direction (row direction) in the matrix T. Accordingly, the eight cyclic permutation matrices in the parity check matrix $H_{QCL}$ can be represented as $I(0)$, $I(0)$, $I(ab)$, $I((a+jd1)b)$, $I((a+jd1)(b+ld1))$, $I((a+jd2)(b+ld1))$, $I((a+jd2)(b+ld2))$, and $I((a\pm1)(b+ld2))$. Here, the first two I(0)s correspond to a-th and (a+1)-th rows or (a−1)-th and a-th rows.

Hence, by applying the conditional expression represented by Equation (21) to the eight cyclic permutation matrices, following Equation (23-1) can be derived as the masking rule.

[Numerical Expression 19-1]

$$(0-0) + \{ab - (a+jd1) \cdot b\} + \\ \{(a+jd1)(b+ld1) - (a+jd2)(b+ld1)\} + \\ \{(a+jd2)(b+ld2) - (a\pm 1)(b+ld2)\} = \\ ab - ab - b \cdot jd1 + ab + a \cdot ld1 + b \cdot jd1 + jd1 \cdot ld1 - \\ ab - a \cdot ld1 - b \cdot jd2 - jd2 \cdot ld1 + ab + a \cdot ld2 + \\ b \cdot jd2 + jd2 \cdot ld2 - ab - a \cdot ld2 \mp b \mp ld2 = \\ jd1 \cdot ld1 - jd2 \cdot ld1 + jd2 \cdot ld2 \mp b \mp ld2 = 0 \quad (23\text{-}1)$$

Here, when there is "(j+c)·(l+d)≧p", the column index "l" of the first row of the cyclic permutation matrix with p-row× p-column arranged at the row index j and the column index l in the quasi-cyclic code $H_{QCLL}$ is "(j+c)·(l+d)mod p". In this case, Equation (23-1) becomes following Equation (23-2).

[Numerical Expression 19-2]

$$(id1 \cdot jd1 - id2 \cdot jd1 + id2 \cdot jd2 \mp b \mp jd2) \bmod p = 0 \quad (23\text{-}2)$$

In the present embodiment, the mask matrix Z is configured under the condition that it does not satisfy Equation (14), Equation (20), Equation (22), as well as Equation (23-1) or Equation (23-2). This can assure that the minimum loop of the parity check matrix $H_{MQCL}$ after being masked is 10. Below, Equation (23-1) or Equation (23-2) is simply represented as Equation (23).

Although the mask matrix generation processing according to the present embodiment is basically similar to that shown in the flowchart of the first embodiment in FIG. 3, processing that the conditional expression in which the parity check matrix $H_{MQCL}$ after being masked includes the loop 6 and the loop 8 is derived at Step S3 is different therefrom.

As is understood, the present embodiment further derives the condition for the loop 8 configured between the quasi-cyclic matrix $H_{QCLL}$ and the matrix T, in addition to the processing of the fourth embodiment. This can assure that the minimum loop of the parity check matrix $H_{MQCL}$ to be finally determined is 10.

Sixth Embodiment

While the second embodiment specifies the masking rule in a case that the minimum loop of the matrix $H_{MQCLL}$ after being masked (see Equation (17)) is 8 (it does not include the matrix T), for example, the irregular parity check matrix $H_{MQCL}$ finally determined by applying the aforementioned masking rule may include the loop 6 because the parity check matrix $H_{QCL}$ of the QC-LDPC codes with the LDGM structure to which the specific regularity is provided shown in Equation (15) is configured by the quasi-cyclic matrix $H_{QCLL}$ portion and the matrix T portion. Accordingly, in a sixth embodiment, the loop 6 is excluded from the finally determined irregular parity check matrix $H_{MQCL}$ by specifying the masking rule in which the matrix T portion is also considered. Below, the processing that is different from that of the second embodiment will be explained.

In the present embodiment, since the parity check matrix $H_{QCL}$ shown in Equation (15) is configured by the quasi-cyclic matrix $H_{QCLL}$ portion and the matrix T portion, a condition for the loop 6 to be configured between the quasi-cyclic matrix $H_{QCLL}$ and the matrix T is derived in addition to the condition derived in the second embodiment.

For example, a condition that the loop 6 is generated between the matrix T and the quasi-cyclic matrix $H_{QCLL}$ is a case that the six cyclic permutation matrices in the second embodiment include successive I(O)s in the vertical direction (row direction) in the matrix T. Accordingly, the six cyclic permutation matrices in the parity check matrix $H_{QCL}$ can be represented as I(0), I(0), I($q^{a+b}$), I($q^{(a+jd1+b)}$) I($q^{(a+jd1+b+ld1)}$), and I($q^{(a\pm 1+b+ld1)}$). Here, the first two I(0)s correspond to a-th and (a+1)-th rows or (a−1)-th and a-th rows.

Hence, by applying the conditional expression represented by Equation (13) to the six cyclic permutation matrices, following Equation (24) can be derived as the masking rule.

[Numerical Expression 20]

$$(0-0) + \{q^{a+b} - q^{a+jd1+b}\} + \{q^{a+jd1+b+ld1} - q^{b=l+b=jd1}\} = 0$$

$$1 - q^{jd1} + q^{jd1+1} - q^{ld1\pm 1} = 0 \quad (24)$$

In the present embodiment, the mask matrix Z is configured under the condition that it does not satisfy Equation (19) and Equation (24). This can assure that the minimum loop of the parity check matrix $H_{MQCL}$ after being masked is 8.

Although the mask matrix generation processing according to the present embodiment is basically similar to that shown in the flowchart of the first embodiment in FIG. 3, the quasi-cyclic matrix $H_{QCLL}$ (Equation (16)) prepared at Step S2, as well as processing that the conditional expression in which the parity check matrix $H_{MQCL}$ after being masked includes the loop 6 is derived at Step S3 (Equation (19) and Equation (24)), are different therefrom.

The present embodiment may also assure that the minimum loop of the parity check matrix $H_{MQCL}$ after being masked is 10, 12, 14, . . . , by determining the conditional expression for the loop 8, the loop 10, the loop 12, or the like.

As is understood, in the present embodiment, in addition to the processing of the second embodiment, the condition for the loop 6 configured between the quasi-cyclic matrix $H_{QCLL}$ and the matrix T is further derived because the parity check matrix $H_{QCL}$ is configured by the quasi-cyclic matrix $H_{QCLL}$ portion and the matrix T portion. This can assure that the minimum loop of the parity check matrix $H_{MQCL}$ to be finally determined is 8.

Seventh Embodiment

While in the first to the six embodiments the mask matrix Z is configured by performing predetermined search processing using the parity check matrix $H_{QCL}$ of the QC-LDPC codes with the LDGM structure, a seventh embodiment assures that the minimum loop is the loop 8 without performing the aforementioned search processing only when the parity check matrix $H_{QCL}$ shown in Equation (8) is used. Below, the processing that is different from those of the first to the sixth embodiments will be explained.

In the present embodiment, a Euclidean geometry code, a kind of finite geometry codes, is utilized as a basic matrix of the mask matrix Z. A Euclidean geometry code $Z_{EGB}$ as a basis of the mask matrix Z is shown in following Equation (25).

[Numerical Expression 21]

$$Z_{EGB} = \begin{bmatrix} 1 & 1 & & 1 & & & & 1 & & & & & \\ & 1 & 1 & & 1 & & & & 1 & & & & \\ & & 1 & 1 & & 1 & & & & 1 & & & \\ & & & 1 & 1 & & 1 & & & & 1 & & \\ & & & & 1 & 1 & & 1 & & & & 1 & \\ & & & & & 1 & 1 & & 1 & & & & 1 \\ 1 & & & & & & 1 & 1 & & 1 & & & \\ & 1 & & & & & & 1 & 1 & & 1 & & \\ & & 1 & & & & & & 1 & 1 & & 1 & \\ & & & 1 & & & & & & 1 & 1 & & 1 \\ 1 & & & & 1 & & & & & & 1 & 1 & \\ & 1 & & & & 1 & & & & & & 1 & 1 \\ 1 & & 1 & & & & 1 & & & & & & 1 \end{bmatrix} \quad (25)$$

In the present embodiment, a mask matrix $Z_{EG}$ is generated without performing the search processing by permutating the Euclidean geometry code $Z_{EGB}$ with a predetermined rule. Specifically, when the two-dimensional (0, s=2)-order Euclidean geometry code $Z_{EGB}$ represented by the cyclic matrix is set as $Z_{EGB}=[h_{m,n}]$, $1 \leq m \leq 2^{2s}-1$, $1 \leq n \leq 2^{2s}-1$, and when $2^{2s}-1$ is a multiple of 3, permutation processing is performed by Equation (26).

[Numerical Expression 22]

$$Z_{EG}=[h_{[m-1}n3]+], 1 \leq m \leq 2^{2s}-1, 1 \leq n \leq 2^{2s}-1 \quad (26)$$

Additionally, when the two-dimensional (0, s=2)-order Euclidean geometry code $Z_{EGB}$ represented by the cyclic matrix is set as $Z_{EGB}=[h_{m,n}]$, $1 \leq m \leq 2^{2s}-1$, $1 \leq n \leq 2^{2s}-1$, and when $2^{2s}-1$ is other than a multiple of 3, the permutation processing is performed by Equation (27).

[Numerical Expression 23]

$$Z_{EG}=[h_{(5nm)]}\leq m \leq 2^{2s}-1, 1 \leq n \leq 2^{2s}-1 \quad (27)$$

Hence, the mask matrix $Z_{EG}$ according to the present embodiment, which is the Euclidean geometry code $Z_{EGB}$ shown in Equation (25) permutated according to Equation (26) and Equation (27), can be represented as shown in Equation (28).

[Numerical Expression 24]

$$Z_{EG} = \begin{bmatrix} 1 & 1 & & 1 & & & & 1 & & & & & \\ & 1 & 1 & & 1 & & & & 1 & & & & \\ & & 1 & 1 & & 1 & & & & 1 & & & \\ 1 & & & & & 1 & 1 & & 1 & & & & \\ 1 & & & 1 & & & & & & 1 & 1 & & \\ & 1 & 1 & & 1 & & & & & & & 1 & \\ & & 1 & 1 & & 1 & & & & & & & 1 \\ & & & & & & & 1 & 1 & & 1 & & 1 \\ & 1 & & & & & & & 1 & 1 & & 1 & \\ & & 1 & & & & & & & 1 & 1 & & 1 \\ & & & 1 & 1 & & 1 & & & & & & \\ & & & & 1 & 1 & & 1 & & & & & \\ 1 & & & & & & 1 & 1 & & & & & \\ & 1 & & & & & & 1 & 1 & & & & \\ 1 & & 1 & & & & & & & & & & 1 \end{bmatrix} \quad (28)$$

Note that, when s of the two-dimensional (0, s)-order Euclidean geometry code is an integer of 2 or greater, a mask pattern that can assure the loop 8 or greater can be generated by the aforementioned operation.

Figure 4:
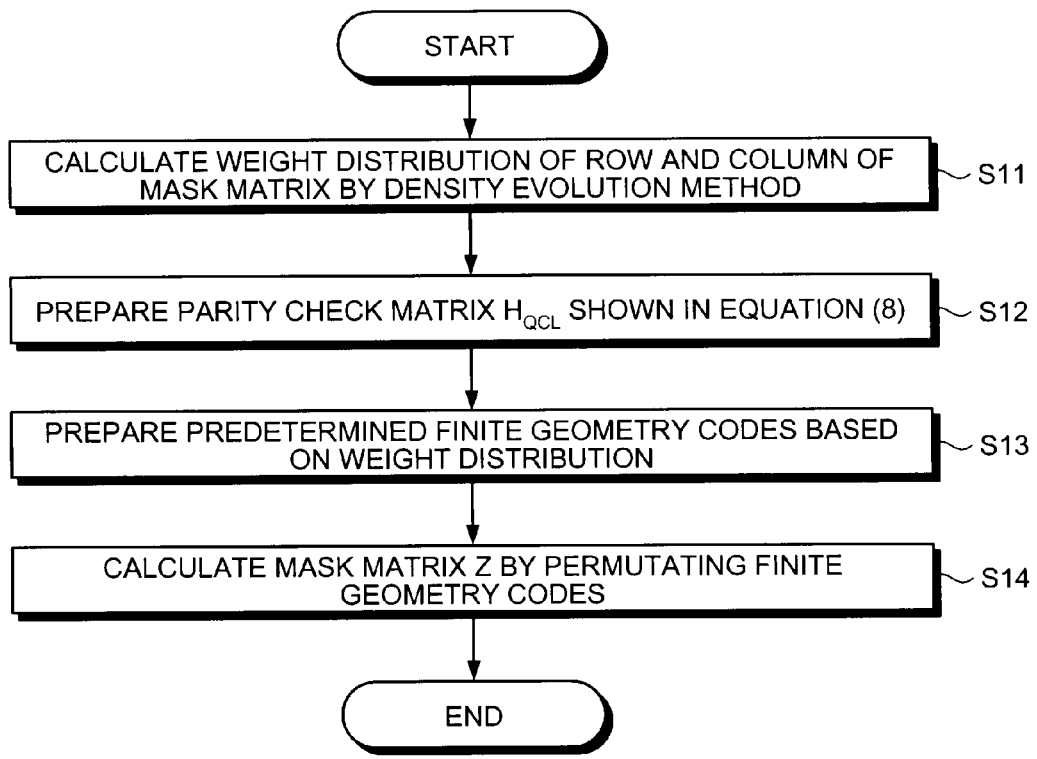
FIG. 4 is a flowchart showing an example of mask matrix generation processing according to the first embodiment.

Subsequently, the mask matrix generation processing performed by the communication apparatus according to the present embodiment will be specifically explained. FIG. 4 is a flowchart showing the mask matrix generation processing according to the present embodiment.

First, the weight distribution of the rows and the columns of the mask matrix $Z_{EG}$ is calculated by the LDPC encoder 1 in the communication apparatus using the density evolution method (Step S11). The LDPC encoder 1 then prepares the parity check matrix $H_{QCL}$ shown in Equation (8) (Step S12), and further prepares a predetermined Euclidean geometry code based on the weight distribution of the rows and the columns calculated at Step S11 (Step S13).

The LDPC encoder 1 then permutates the Euclidean geometry code prepared at Step S13 by the processing of Equation (26) and Equation (27) so as to set the permutation processing result as the mask matrix $Z_{EG}$ (Step S14). Here, with this structure, changing the size of the cyclic permutation matrix allows a code length to be variable.

As is understood, in the present embodiment, the masking processing is performed using the mask matrix $Z_{EG}$, which is the Euclidean geometry code permutated according to the predetermined rule, to generate the irregular parity check matrix, only when the parity check matrix $H_{QCL}$ shown in Equation (8) is used. Since this eliminates the need to perform the aforementioned search processing of the mask matrix, a calculation amount can be greatly reduced.

Eighth Embodiment

In an eighth embodiment, a code used for erasure error correction is configured using the quasi-cyclic matrix $H_{QCLL}$ included in the parity check matrix $H_{QCL}$ shown in Equation (8) and the Euclidean geometry.

Figure 5:
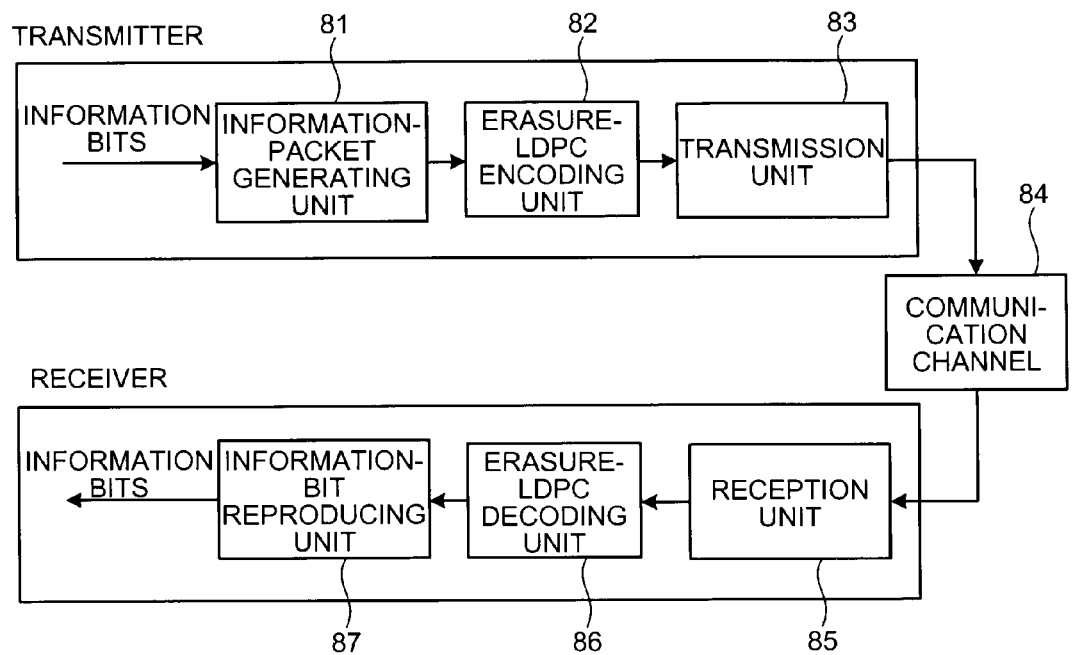
FIG. 5 is a view showing a configuration example of an erasure-correction LDPC encoding/decoding system according to the present invention.

Below, the communication system using the LDPC codes in configuring erasure error correction codes will be explained. FIG. 5 is a view showing a configuration example of an erasure-correction LDPC encoding/decoding system according to the present invention. In this erasure-correction LDPC encoding/decoding system, a communication apparatus on a transmission-side is provided with an information-Packet generating unit 81, an Erasure-LDPC encoding unit 82, and a transmission unit 83, while a communication apparatus on a reception-side is provide with a reception unit 85, an erasure-LDPC decoding unit 86, and an information-bit reproducing unit 87. Here, the LDPC codes as erasure correction codes are error correction codes for data packetized into a specific size to be transmitted to the transmission unit 83 or to be received from the reception unit 85. Additionally, the data in the packet received from the reception unit 85 is considered to be 100% correct when reception is performed successfully, or considered that it is erased when the reception is performed unsuccessfully.

In FIG. 5, the information-Packet generating unit 81 generates a sequence per predetermined packet size length L in conjunction with a position number of the packet using an information bit sequence, and packetizes the sequence. At this time, the number of all the packets is k, the sequence of each packet is represented as IP(1), IP(2), ..., IP(k), and an argument of each sequence is made to be the position number. Then, the Erasure-LDPC encoding unit 82 encodes the packet. At this time, the number of all the encoded packets is k, the sequence of the encoded packet is C(1), C(2), ..., C(k), and the argument of each sequence is made to be the position number.

Thereafter, the encoded packet is transmitted to the transmission unit 83, where a signal, to which processing such as modulation is performed, is transmitted to a communication channel 84. Here, it is assumed that there is noise or the like in the communication channel 84.

Meanwhile, the signal passed through the communication channel 84 is received by the reception unit 85, where only the packet that is successfully received is transmitted to the erasure-LDPC decoding unit 86. Namely, since the erasure-LDPC decoding unit 86 receives only the successful packet, it receives the packet sequence lacking the position number, such as the packet sequence of C(1), C(3), C(7), ..., C(k), for example, and generates IP(1), IP(2), ..., IP(k) from the packet. The information-bit reproducing unit 87 then reproduces a transmission information bit sequence from the received packet.

Subsequently, encoding processing/decoding processing in the erasure-correction LDPC encoding/decoding system will be explained in detail.

For example, it is assumed that the packet size length L=1 for ease of explanation. Under this assumption, replacement is performed as in $I_1=IP(1), I_2=IP(2), I_3=IP(3), \ldots, I_k=IP(k)$, $c_1=C(1), c_2=C(2), c_3=C(3), \ldots, c_k=C(k)$. When $I=(I_1\ I_2\ I_3 \ldots I_k), C=(C_1\ C_2\ C_3 \ldots C_k)$, and the check matrix for erasure correction is $H_{ers}$, encoding can be performed as represented in following Equation (29), where $(\cdot)^T$ is a transposed matrix.

[Numerical Expression 25]

$$C^T = H_{ers} \cdot I^T \tag{29}$$

The Erasure-LDPC encoding unit 82 passes C to the transmission unit 83, and the reception unit 85 receives only the packet that is successfully received via the communication channel 84. Below, the packet is replaced by the bit for explanation because the packet length L=1. When assuming a binary erasure channel of {0, 1}, the erasure correction code is decoded using a received bit with bit numbers greater than the received information length. For example, it is assumed that the successfully received bit received the received bit with probability 1 and the unsuccessfully received bit received 0 or 1 with probability ½. Generally, the unsuccessfully received bit is ignored and the decoding is performed using only the successfully received bit. Here, only the columns corresponding to the successfully received bits are extracted using the check matrix $H_{ers}$, and coupled per column to re-configure the matrix for decoding. At this time, when a rank of this matrix is equal to the information length, the information bit can be decoded. In the decoding, the longer the loop length is, the fewer the linear dependent columns are when an arbitrary column of the check matrix is extracted, and the higher the probability is wherein the rank is equal to the information length with the fewer number of successfully received bits longer than the information length.

Accordingly, as the check matrix $H_{ers}$ for the erasure correction, the quasi-cyclic matrix $H_{QCLL}$ or the masking quasi-cyclic matrix $H_{MQCLL}$ without T shown in the first to the sixth embodiments can be used.

Additionally, by representing a position of "1" in a specific column of the Euclidean geometry code using a polynomial and generating the cyclic matrix, a cyclic matrix $Z_{EGBE}$ with 22-row×15-column without the loop 4 can be configured. Specifically, the polynomial corresponding to the column index "1" of the first row of Equation (25) is represented as $y=x^0+x^1+x^3+x^7$. This polynomial is assumed to be a polynomial expression corresponding to the column index "1" of the first row, and the cyclic matrix shifted by one row per movement of one column is labeled as $Z_{EGBE}$ as shown in following Equation (30). Since the matrix $Z_{EGBE}$ itself also does not include the loop 4, it can be used as $H_{ers}$.

[Numerical Expression 26]

$$Z_{EGBE} = \begin{bmatrix} 1 & & & & & & & & & & & & & & \\ 1 & 1 & & & & & & & & & & & & & \\ & 1 & 1 & & & & & & & & & & & & \\ 1 & & 1 & 1 & & & & & & & & & & & \\ & 1 & & 1 & 1 & & & & & & & & & & \\ & & 1 & & 1 & 1 & & & & & & & & & \\ & & & 1 & & 1 & 1 & & & & & & & & \\ 1 & & & & 1 & & 1 & 1 & & & & & & & \\ & 1 & & & & 1 & & 1 & 1 & & & & & & \\ & & 1 & & & & 1 & & 1 & 1 & & & & & \\ & & & 1 & & & & 1 & & 1 & 1 & & & & \\ & & & & 1 & & & & 1 & & 1 & 1 & & & \\ & & & & & 1 & & & & 1 & & 1 & 1 & & \\ & & & & & & 1 & & & & 1 & & 1 & 1 & \\ & & & & & & & 1 & & & & 1 & & 1 & 1 \\ & & & & & & & & 1 & & & & 1 & & 1 \\ & & & & & & & & & 1 & & & & 1 & \\ & & & & & & & & & & 1 & & & & 1 \\ & & & & & & & & & & & 1 & & & \\ & & & & & & & & & & & & 1 & & \\ & & & & & & & & & & & & & 1 & \\ & & & & & & & & & & & & & & 1 \end{bmatrix} \tag{30}$$

Moreover, when the two-dimensional (0, s=2)-order Euclidean geometry code $Z_{EGBE}$ shown in Equation (30) is $Z_{EGBE}=[h_{m,n}]$, $1\leq m\leq M$, and $1\leq n\leq N$, a matrix $Z_{EGE}$ shown in following Equation (33) is generated using the Euclidean geometry code $Z_{EGBE}$ with the operation similar to that for creating Equation (28), namely, with the processing of Equation (31) and Equation (32).

(I) When M is a multiple of 3:

[Numerical Expression 27]

$$Z_{EGE}=[h_{\lfloor(m-1)/3\rfloor+(5(m-1)+1)m\times 2^{2s}-1),n}], 1\leq m\leq M,$$
$$1\leq n\leq 2^{2s}-1 \tag{31}$$

(II) When M is other than a multiple of 3:

[Numerical Expression 28]

$$Z_{EGE} = [H_{(5(m-1)+1) mod(2^{2s}-1), n}], \ 1 \le m \le M, \ 1 \le n \le 2^{2s} - 1 \quad (32)$$

[Numerical Expression 29]

$$Z_{EGE} = \begin{bmatrix}
1 & & & & & & & & & & & & \\
& 1 & 1\ 1 & & & & & & & & & & \\
& & 1 & & 1 & 1\ 1 & & & & & & & \\
& & & & & 1 & & 1 & 1 & & & & \\
& & & & & & & & & 1 & & & \\
1 & 1\ 1 & & & & & & & & & & & \\
& 1 & & 1 & 1\ 1 & & & & & & & & \\
& & & & 1 & & 1 & 1\ 1 & & & & & \\
& & & & & & & & 1 & & & & \\
1\ 1 & & & & & & & & & & & & \\
& & 1 & 1\ 1 & & & & & & & & & \\
& 1 & & 1 & 1\ 1 & & & & & & & & \\
& & & & & 1 & & 1 & & & & & \\
& & & & & & & & & 1 & & & \\
& 1 & 1\ 1 & & & & & & & & & & \\
1 & & 1 & 1\ 1 & & & & & & & & & \\
& & & 1 & & 1 & 1\ 1 & & & & & & \\
& & & & & & & 1 & & & & & \\
1\ 1 & & & & & & & & & & & & \\
1 & & 1 & 1\ 1 & & & & & & & & & \\
& & & 1 & & 1 & 1\ 1 & & & & & & \\
& & & & & & & 1 & & & 1 & & \\
\end{bmatrix} \quad (33)$$

In this case, an erasure correction code C with a non-systematic code length of 22 bits (length N) is generated by following Equation (34) using the matrix $Z_{EGE}$, and information I with the information length of 15 bits (length K). Additionally, the erasure correction code C with the non-systematic code length of 22 bits (length N) may be generated by generating the matrix $H_{MQCLL}$ ($=Z_{EGE} \times H_{QCLL}$) using Equation (9-2), and using the irregular matrix $H_{MQCLL}$, and the information I with the information length of 15 bits (length K).

[Numerical Expression 30]

$$C = Z_{EGE} \cdot I \quad (34)$$

Ninth Embodiment

In a ninth embodiment, the LDPC codes corresponding to a plurality of encoding rates are configured using the irregular parity check matrix $H_{MQCL}$ determined in the first to the seventh embodiments, namely, the parity check matrix $H_{MQCL}$ ($=[Z \times H_{QCLL} | T]$: Z is replaced with $Z_{EG}$ in the seventh embodiment) of the masking quasi-cyclic code shown in Equation (11).

Figure 6:
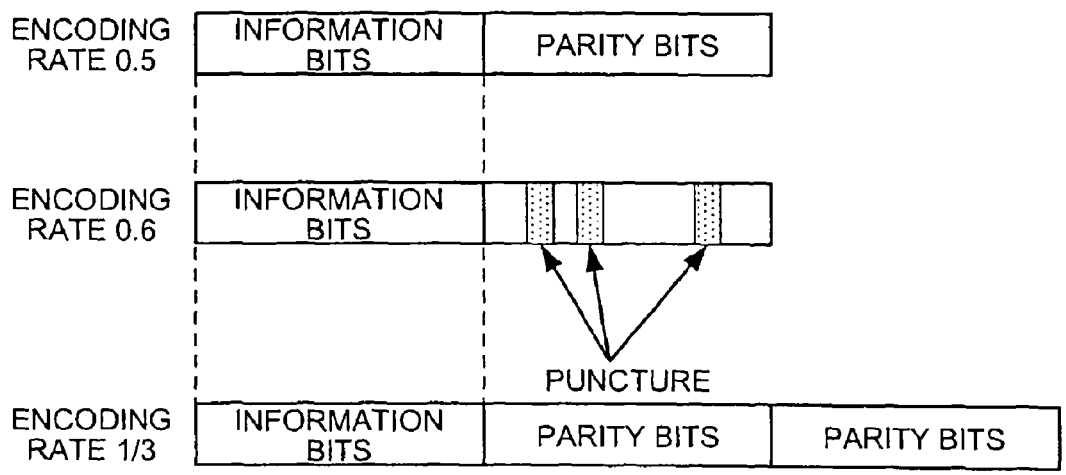
FIG. 6 is a view showing an example of a code configuration method.

In the present embodiment, the code of the specific encoding rate is set as a reference, puncture is performed with respect to the encoding rate higher than the reference code (the parity of the code is thinned out), whereas the parity is increased with respect to the low encoding rate. At this time, in the present embodiment, the aforementioned processing is achieved using one parity check matrix $H_{MQCL}$ without individually generating the parity check matrix according to the encoding rate. FIG. 6 is a view showing a code configuration method according to the present embodiment, wherein for example, codes of the encoding rate 0.5 are defined as a reference code, parity is punctured with respect to the encoding rate higher than that, and parity is added with respect to the low encoding rate.

Here, the aforementioned processing will be explained specifically. In the present embodiment, to achieve the encoding rates using one parity check matrix $H_{MQCL}$, the parity check matrix corresponding to the low encoding rate (1/3 in the example of FIG. 7) is generated by expanding the parity check matrix $H_{MQCL}$ with reference to the encoding rate 0.5. A degree distribution when expanding the parity check matrix is calculated by the density evolution method.

Figure 7:
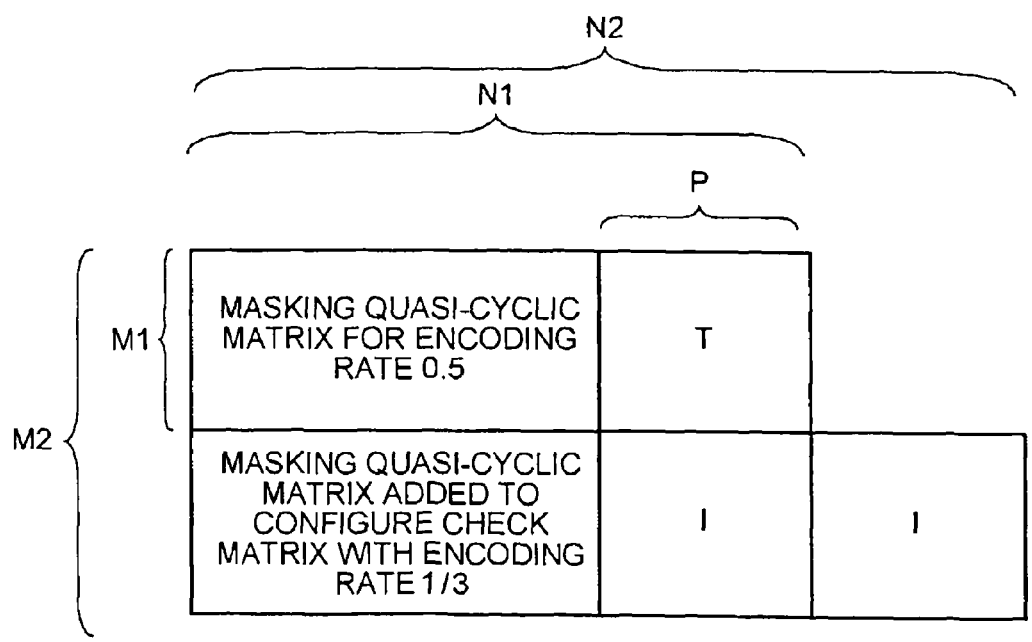
FIG. 7 is a view showing an example when a parity check matrix is expanded according to an encoding rate.

In FIG. 7, the check matrix with M1-row×N1-column corresponds to the encoding rate 0.5, and the check matrix with M2-row×N2-column corresponds to the encoding rate 1/3 while maintaining the configuration of the check matrix with M1-row×N1-column. In addition, I on the right-hand side of the figure represents a unit matrix, which is arranged for the expanded parity check matrix to maintain the LDGM structure. Although I on the left-hand side of the figure also represents the unit matrix, this portion is not limited thereto and any matrix may be arranged as long as it can achieve excellent performance.

Meanwhile, the high encoding rate is addressed by the puncture of the parity. Specifically, the code is created using the check matrix with M1-row×N1-column (for the encoding rate 0.5), the parity bits corresponding to the column in P portion are deleted from the created code at regular or irregular intervals, and the code having the encoding rate higher than 0.5 is generated.

For example, when a systematic code v with the encoding rate 0.5 is represented as $v=(u_1, u_2, \ldots, u_k, p_1, p_2, \ldots, p_{M1})$, and the parity is represented as $p=(p_1, p_2, \ldots, p_{M1})$ that corresponds to the encoding rate 0.5, the code corresponding to the encoding rate 0.6 is generated by puncturing 1/3 of elements of p. In this case, a position p' of the parity to be punctured is represented as $p'=(p_1, p_4, p_7, p_{10}, \ldots)$, for example. As for a puncture pattern, bit intervals are rendered to be as long as possible. This is because the parity bits generated by the parity check matrix with the LDGM structure often become successive "1"s or "0"s. For explanation based on a specific circuit configuration, in the circuit example of the encoder shown in FIG. 2-2, while $p_{p,j}$ corresponds to the parity and $p_{p,j}=(1\ 0\ 1\ 0\ 1\ 0\ 1\ 1\ 0\ 1\ 1\ 0\ 0\ 0\ 1)$ is generated in the encoder, a punctured parity $p_{p,j}^{punc}$ is represented as $p_{p,j}^{punc}=(1\ 1\ 1\ 1\ 0\ 1\ 0\ 1)$ by puncturing the even-numbered bits.

Figure 8:
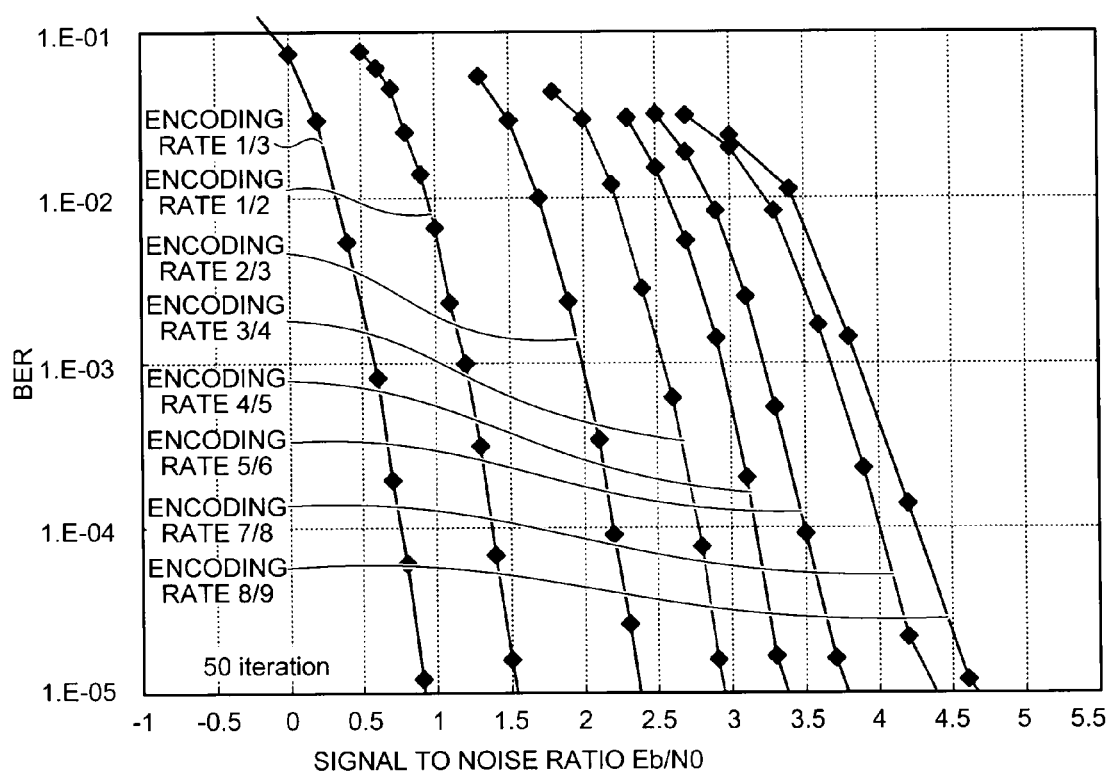
FIG. 8 is a view showing characteristics of the codes corresponding to a plurality of encoding rates.

FIG. 8 is a view showing characteristics of the codes corresponding to the encoding rates generated by the aforementioned processing. In a code configuration method according to the present embodiment, when the information length is approximately 1400, for example, performance with BER=$10^{-4}$ within 1.5 dB from the Shannon limit is achieved for all the encoding rates 1/3, 1/2, 2/3, 3/4, 4/5, 5/6, 6/7, 7/8, and 8/9.

As is understood, in the present embodiment, the code of the specific encoding rate is set as a reference, the puncture of the parity is performed with respect to the encoding rate higher than the reference code, whereas the parity is increased with respect to the low encoding rate, and at that time, the puncture processing and parity adding processing are achieved using one parity check matrix $H_{MQCL}$ without individually generating the parity check matrix according to the encoding rate. As a result of this, it is possible to easily deal with the encoding rates, and it further becomes unnecessary to prepare the parity check matrix corresponding to the number of encoding rates, allowing the circuit scale to be greatly reduced as compared with that of the conventional technology.

Tenth Embodiment

Subsequently, decoding processing corresponding to the encoding processing using the irregular parity check matrix $H_{MQCL}$ generated by the processing of the first to the ninth embodiments will be explained.

The "cyclic approximation min algorithm" according to the present embodiment that is explained below is a decoding algorithm, an improved "Min-Sum algorithm" that is an approximate decoding system of a general "Sum-Product algorithm". The "cyclic approximation min algorithm" is a decoding system for performing the decoding using an approximate minimum value, rather than an accurate minimum value, in which only an absolute value of LLR for a minimum k value is cyclically updated. The minimum k value represents "from a minimum value to a k-th value in an ascending order".

Subsequently, a configuration of the LDPC decoder 5 configuring the reception apparatus according to the present invention and the decoding method by the LDPC decoder 5 will be explained in detail according to the figures.

Figures 1, 9:
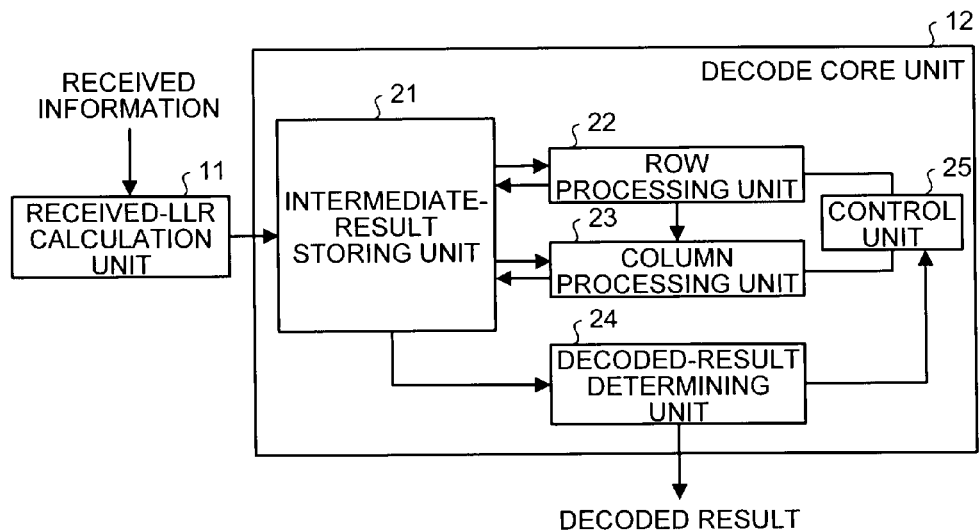
Figures 2, 9:
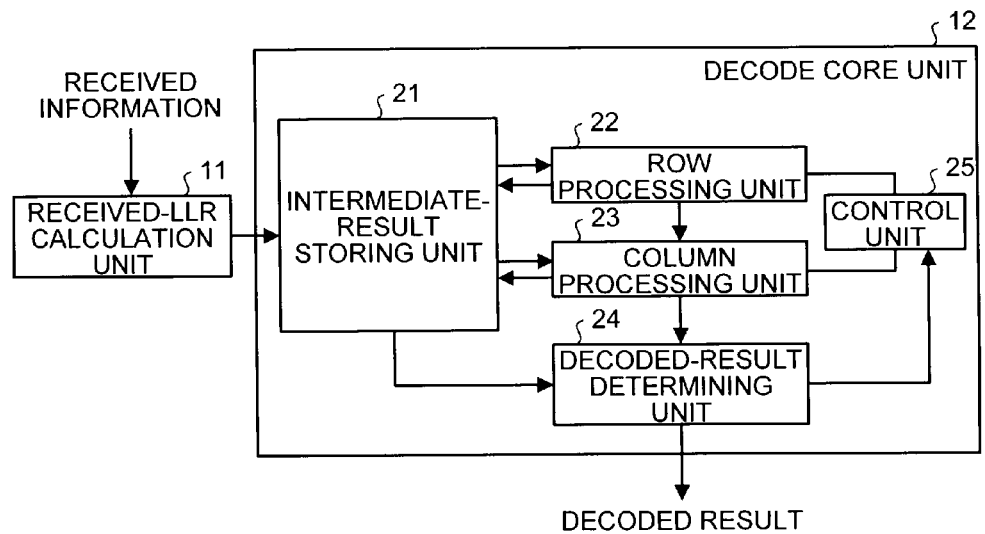

FIG. 9-1 is a view showing a configuration of the LDPC decoder 5 according to the present embodiment, wherein the LDPC decoder 5 is configured by a received-LLR calculation unit 11 for calculating received LLR (logarithmic likelihood ratio) from received information and a decode core unit 12 for performing decoding processing. The decode core unit 12 is provided with an intermediate-result storing unit 21 configured by a memory for holding the intermediate result of decoding (intermediate value), a row processing unit 22 for executing row processing, a column processing unit 23 for executing column processing, a decoded-result determining unit 24 for performing hard decision of a posterior value in the column processing and accuracy determination of the parity check result as a stopping rule of the decoding processing, and a control unit 25 for performing repetition control of decoding.

Here, the "cyclic approximation min algorithm" executed in the reception apparatus will be shown below. When assumed that the communication channel is a binary input AWGN channel, a logarithmic likelihood ratio $\lambda_n$ of the n-th symbol is as shown in following Equation (35)

[Numerical Expression 31]

$$\lambda_n = \ln \frac{P(y_n \mid x_n = 0)}{P(y_n \mid x_n = 1)} = 2y_n/\sigma^2 \tag{35}$$

However, $x_n$ is a value of the n-th symbol of binary $\{0, 1\}$, and this $x_n$ is modulated as shown in following Equation (36) for transmission on the transmission side.

[Numerical Expression 32]

$$m_n = \begin{cases} 1 & \text{if } x_n = 0 \\ -1 & \text{if } x_n = 1 \end{cases} \tag{36}$$

In addition, a noise vector $e=(e_1, e_2, \ldots, e_n, \ldots, e_N)$ with a variance $\sigma^2$ is added at the communication channel, and the reception side receives a reception value $y=(y_1, y_2, \ldots, y_n, \ldots, y_N)$ shown in following Equation (37).

[Numerical Expression 33]

$$y_n = m_n + c_n \tag{37}$$

When the check matrix of the LDPC codes using the puncture shown in the eighth embodiment and the expansion of the check matrix is used, the logarithmic likelihood ratio $\lambda_n$ of the bit to be punctured by the LDPC decoder 5 is as shown in following Equation (38).

[Numerical Expression 34]

$$\lambda_n^p = \ln \frac{P(y_n \mid x_n = 0)}{P(y_n \mid x_n = 1)} = \ln(1/2/1/2) = 0 \tag{38}$$

(Initialization Step)

First, a repetition number of times $l=1$ and a maximum repetition number of times $l_{max}$ are set. Moreover, initial LLR of the minimum k value at m-th row is set as $\beta_{mn(i)}^{(0)}$, a reception LLR: $\lambda_n$ is inputted, and $B_{mn(i)}$ is calculated as shown in following Equation (39). In addition, $\text{sgn}(\lambda_n)$ is inputted as a code of initial LLR: $\beta_{mn}^{(0)}$ at the m-th row and $S_m$ is calculated as shown in following Equation (39).

[Numerical Expression 35]

$$B_{mn(i)} = |\beta_{mn(i)}^{(0)}| = \min_{n \in N(m)\backslash\{n(1),n(2),\ldots,n(i-1)\}} [|\lambda_n|], \forall i \in [1, k] \tag{39}$$

$$S_m = \prod_{n \in N(m)} \text{sgn}(\lambda_n)$$

$$n(i) = \arg\min_{n \in N(m)\backslash\{n(1),n(2),\ldots,n(i-1)\}} [|\lambda_n|]$$

$$n(0) = \varphi$$

Where $B_{mn(i)}$ is an absolute value of LLR: $\beta_{mn(i)}$ of the minimum k value at the m-th row, n(i) is the column index of the minimum i-th LLR in $B_{mn(i)}$, and $S_m$ is a product of codes (+ or −) of LLR: $\beta_{mn}$ at the m-th row.

(Row Processing Step)

Next, as the row processing step, LLR: $\alpha_{mn}^{(l)}$ of l-th repetition of a bit n to be transmitted from a check node m to a bit node n is updated by following Equation (40) for $1 \le n \le N$ and each m. In the present embodiment, a starting column of the row processing is arbitrary, and the decoding processing is cyclically performed again from the starting column after the processing is completed through the last column.

[Numerical Expression 36]

$$\alpha_{mn}^{(l)} = \prod_{\substack{n' \in N(m)\backslash n \\ n' < n}} \text{sgn}(\beta_{mn'}^{(l)}) \cdot \prod_{\substack{n' \in N(m)\backslash n \\ n' > n}} \text{sgn}(\beta_{mn'}^{(l-1)}) \cdot \min_{n' \in N_k(m)\backslash n} [B_{mn'}] \tag{40}$$

$$= S_m \cdot \text{sgn}(\beta_{mn}^{(l-1)}) \cdot \min_{n' \in N_k(m)\backslash n} [B_{mn'}]$$

$$= S'_m \cdot \min_{n' \in N_k(m)\backslash n} [B_{mn'}]$$

$$S'_m = S_m \cdot \text{sgn}(\beta_{mn}^{(l-1)})$$

Specifically, when the current column index is n, the product of the codes of LLR: $\beta_{mn}^{(l)}$ updated in the l-th column processing is obtained for the column indexes satisfying "n'<n", whereas the product of LLR: $\beta_{mn'}^{(l-1)}$ updated in the (l−1)-th column processing is obtained for the column indexes satisfying "n'>n", and then the multiplication result of these results and the minimum LLR: min[$\beta_{mn'}$] among the minimum k values at the m-th row is set as updated LLR: $\alpha_{mn}^{(l)}$ at the column index n. In the present embodiment, a term to multiply the product of the codes of $\beta_{mn'}^{(l)}$ and the product of the codes of $\beta_{mn'}^{(l-1)}$ is further replaced with a term to multiply $S_m$ updated for the (l−1)-th time and the codes of $\beta_{mn'}$ updated for the (l−1)-th time. Thereby, a calculation amount and a memory amount can be further reduced. Here, $N_k(m)$ in Equation (40) is a set of n(i) at the m-th row, represented as $N_k(m)=\{n(1), n(2), \ldots, n(k)\}$.

(Column Processing Step)

Next, as the column processing, LLR: $\beta_{mn}^{(l)}$ of l-th repetition of the bit n to be transmitted from the bit node n to the check node m is updated by following Equation (41) for each m and n.

[Numerical Expression 37]

$$\beta_{mn}^{(1)} = \lambda_n + \sum_{m' \in M(n)\setminus n} \alpha_{m'n}^{(1)} \quad (41)$$

$$S_m = S_m' \cdot \mathrm{sgn}(\beta_{mn}^{(1)})$$

$$n(i) = \arg\min_{n' \in N_k(m)\setminus\{n(1),n(2),\ldots,n(i-1),n(i)\}} [B_{mn'}, |\beta_{mn}^{(1)}|]$$

$$B_{mn(i)} = \min_{n' \in N_k(m)\setminus\{n(1),n(2),\ldots,n(i-1),n(i)\}} [B_{mn'}, |\beta_{mn}^{(1)}|], \forall i \in [1, k]$$

Specifically, the addition result of the reception LLR: $\lambda_n$ and a total value of LLR: $\alpha_{m'n}^{(l)}$ at other than the m-th row updated in the l-th row processing is set as updated LLR: $\beta_{mn}^{(l)}$ at the column index n. Moreover, by multiplying $S_m'$ and the codes (+ or −) of $\beta_{mn}^{(l)}$ updated in the l-th column processing, $S_m$ used for the row processing is updated. Here, the lower two equations in Equation (41) specify the permutation processing (minimum k value) of $B_{mn(l)}$.

For each n, a posterior value $\beta_n^{(l)}$ of the l-th repetition of the bit n is updated by following Equation (42) for the hard decision.

[Numerical Expression 38]

$$\beta_n^{(1)} = \lambda_n + \sum_{m' \in M(n)} \alpha_n^{(1)} \quad (42)$$

(Stopping Rule)

Thereafter, for example, the decoded result is set as "$x_n'=1$" (x' corresponds to an original transmission signal x) when the posterior value $\beta_n^{(l)}$ of the l-th repetition of the bit n is "$\beta_n^{(l)}>0$", whereas the decoded result is set as "$x_n'=0$" when "$\beta_n^{(l)} \leq 0$", so that the decoded result $x'=(x_1', x_2', \ldots, x_N')$ is obtained. When the result of the parity check is "Hx'=0" or the repetition number of times is "l=$l_{max}$" (when either of the conditions is satisfied), the decoded result x' at that time is outputted. Here, if both of the conditions are not satisfied, then "l=l−1", and the processing returns to the row processing to sequentially perform the operation.

Next, characteristic operations of the LDPC decoder 5 that executes the "cyclic approximation min algorithm" will be specifically explained using a configuration diagram.

Figure 10:
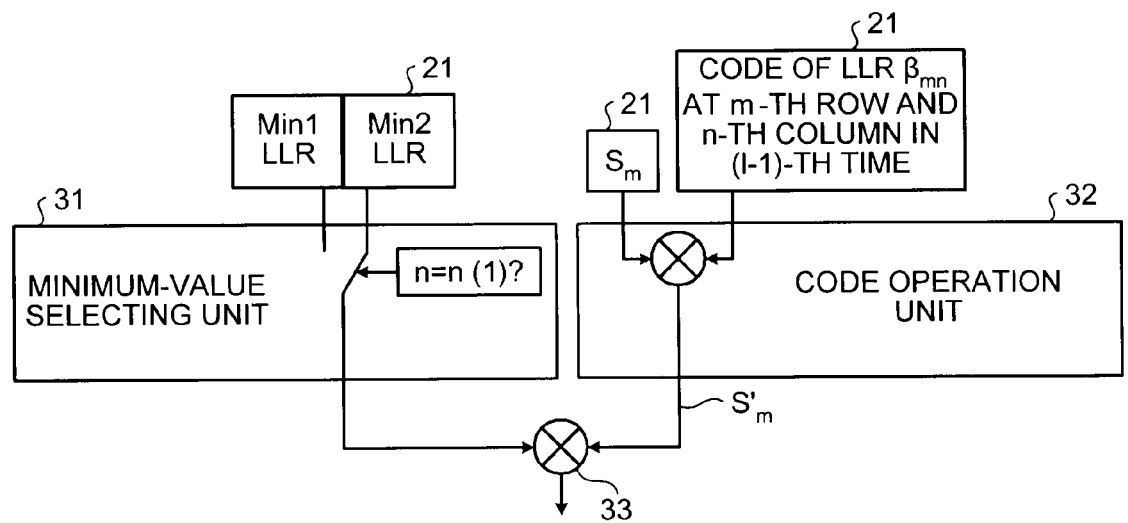
FIG. 10 is a view showing a configuration example of a row processing unit that executes a row processing in a "cyclic approximation min algorithm".

FIG. 10 is a view showing a configuration example of the row processing unit 22 that executes the row processing in the "cyclic approximation min algorithm", wherein the row processing unit 22 is configured by a minimum-value selecting unit 31, a code operation unit 32, and an LLR calculation unit 33. In this figure, Min1LLR (the minimum LLR at the m-th row) is $B_{mn(1)}$ and Min2LLR (the second minimum LLR at the m-th row) is $B_{mn(2)}$, both of which are the values respectively held in the intermediate-result storing unit 21. Also in this figure, $S_m$ and "code of LLR: $\beta_{mn}$ at the m-th row and the n-th column in the (l−1)-th time" are also the values respectively held in the intermediate-result storing unit 21.

In the minimum-value selecting unit 31, when the column index n as a target of the row processing and the column index n(1) of Min1LLR ($B_{mn(1)}$) are the same, Min2LLR ($B_{mn(2)}$) is selected, whereas Min1LLR ($B_{mn(1)}$) is selected for other cases to be outputted. The code operation unit 32 multiplies "$S_m$ updated in the (l−1)-th column processing" and "code of LLR: $\beta_{mn}$ at the m-th row and the n-th column in the (l−1)-th time" to output $S_m'$ as the result thereof. At this time, $S_m'$ is held in the intermediate-result storing unit 21. Additionally, the LLR calculation unit 33 multiplies the minimum LLR obtained from the minimum-value selecting unit 31 and the multiplication result of the code $S_m'$ (+ or −) obtained from the code operation unit 32 to calculate LLR: $\alpha_{mn}^{(1)}$. With this configuration, an amount of the memory that has been required for the row weight in the "Min-Sum algorithm" can be reduced to an amount corresponding to the k value.

Figures 1, 11:
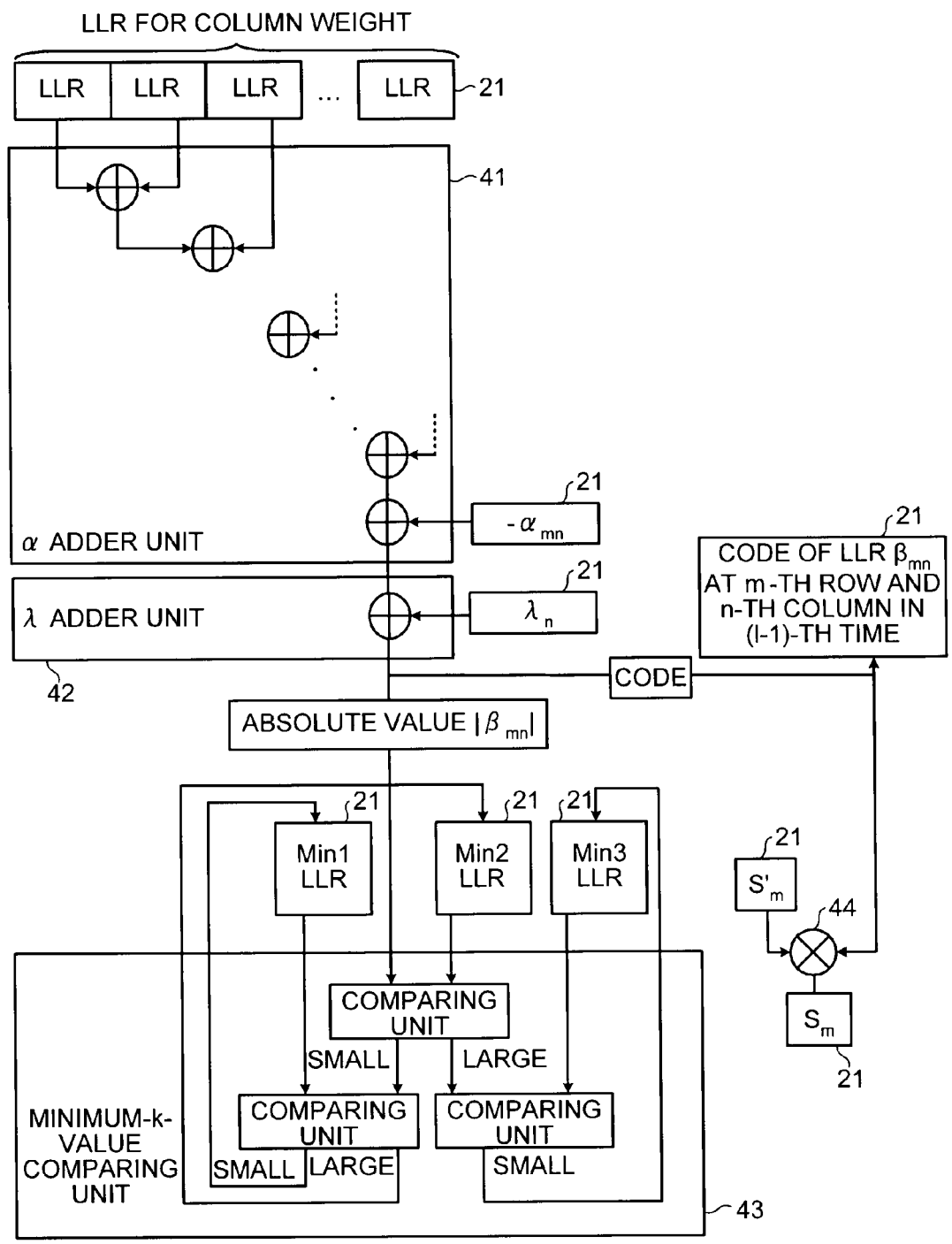
Figures 2, 11:
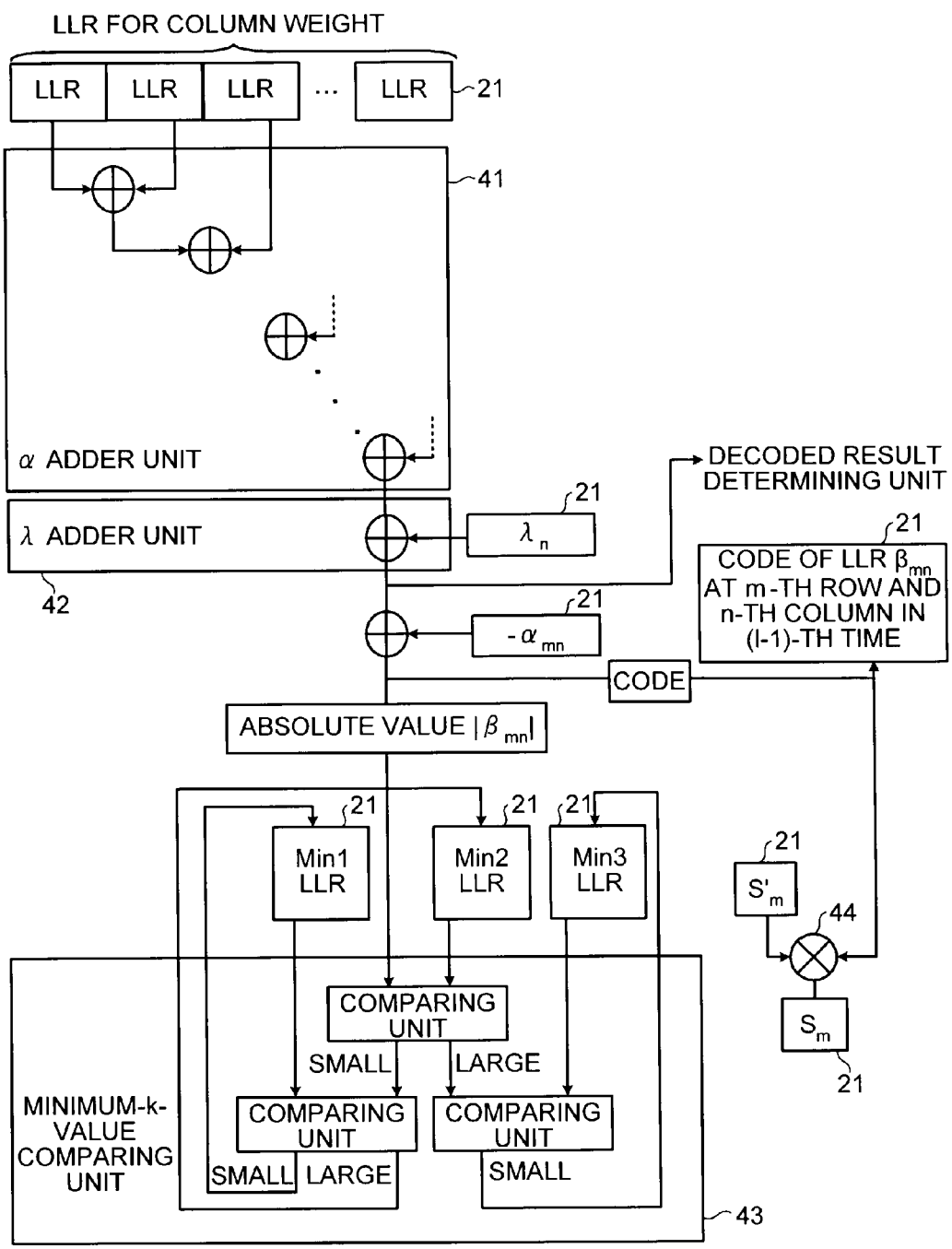

FIG. 11-1 is a view showing a configuration example of the column processing unit 23 that executes column processing in the "cyclic approximation min algorithm", wherein the column processing unit 23 is configured by an $\alpha$ adder unit 41, a $\lambda$ adder unit 42, a minimum-k-value comparing unit 43, and a code operation unit 44. In the present embodiment, a case where k=3 is described as an example. In this figure, LLR for the column weight, $\alpha_{mn}$, $\lambda_n$, $S_m'$, Min1LLR, Min2LLR, and Min3LLR (the third minimum LLR at the m-th row) are the values respectively held in the intermediate-result storing unit 21.

Figure 12:
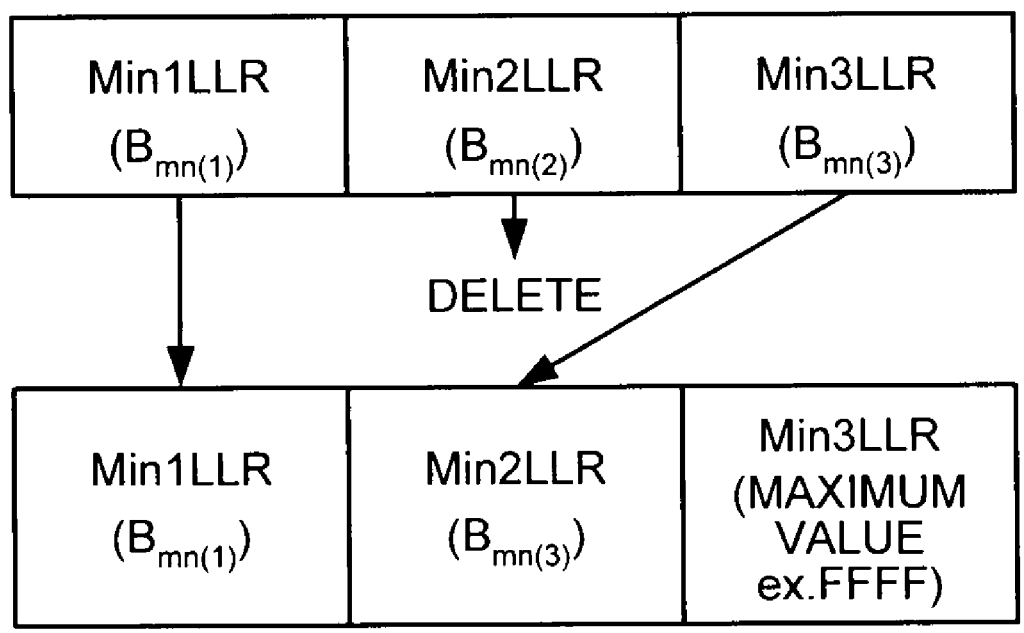
FIG. 12 is a view showing processes when information on n=15 is held at Min2LLR in the column processing of n=15.

In the column processing unit 23, the $\alpha$ adder unit 41 adds all LLR: $\alpha_{m'n}^{(l)}$ at other than the m-th row updated in the l-th row processing, and the $\lambda$ adder unit 42 adds received LLR: $\lambda_n$ to the addition result by the $\alpha$ adder unit 41, to output $\beta_{mn}^{(l)}$. The minimum-k-value comparing unit 43 (k=3) then receives $|\beta_{mn}^{(l)}|$. Here, although not shown in FIG. 11-1, when n at the n-th column as a target of the column processing is the same as any of n(1), n(2), and n(3) representing the column indexes corresponding to $B_{mn(1)}$, $B_{mn(2)}$, and $B_{mn(3)}$ held in Min1LLR, Min2LLR, and Min3LLR, respectively, $B_{mn(i)}$ that satisfies n=n(i) is thinned out, and then the operation as shown in FIG. 12 is performed. Specifically, the information held in Min2LLR is deleted, the information held in Min3LLR is moved to Min2LLR, and further the maximum value "FFFF", for example (in a case of 16-bit), is stored in Min3LLR. This allows comparison processing for other than the column as the processing target, and at least Min3LLR is always updated in the column processing. After this processing, as shown in FIG. 11-1, $|\beta_{mn}^{(l)}|$ is compared to Min1LLR, Min2LLR, and Min3LLR, respectively, and LLRs of the minimum three values are updated if "$|\beta_{mn}^{(l)}|<$Min3LLR". Meanwhile, the code of $\beta_{mn}^{(l)}$ outputted by the $\lambda$ adder unit 42 is held in the intermediate-result storing unit 21 as the "code of LLR: $\beta_{mn}^{(l)}$ at the m-th row and the n-th column in the l-th time", $S_m'$ updated in the l-th row processing and the code of $\beta_{mn}^{(l)}$ are multiplied by the code operation unit 44, and $S_m$ held in the intermediate-result storing unit 21 is updated using the result. Here, it is configured that, when comparing $|\beta_{mn}^{(l)}|$ to Min1LLR, Min2LLR, and Min3LLR, $|\beta_{mn}^{(l)}|$ is first compared to Min2LLR that is a center value of $B_{mn(i)}$ and then compared following a tree-like structure as shown in the figure. This has an effect that execution time becomes {(k+1)/2}/k (if k is an odd number) as compared to a case where the comparison begins with the minimum value, Min1LLR. In addition, although there are two center values of $B_{mn(i)}$ if k is an even number, either of which can be targeted to begin the comparison. There is an effect that the execution time becomes {k/2+1}/k (if k is an even number) as compared to a case where the comparison begins with the minimum value, Min1LLR.

The same processing as explained above can also be achieved with a configuration shown in FIG. 11-2, wherein the α adder unit 41 only adds all LLRs for the column weight, and then the λ adder unit 42 adds $λ_n$ to output the result to the decoding result determination unit 24 while performing subtraction of $α_{mn}$ which is LLR at the m-th row. With such a procedure, the same result as that by the procedure in the aforementioned processing can be obtained. The configuration of the LDPC encoder in this case is as shown in FIG. 9-2.

Figure 13:
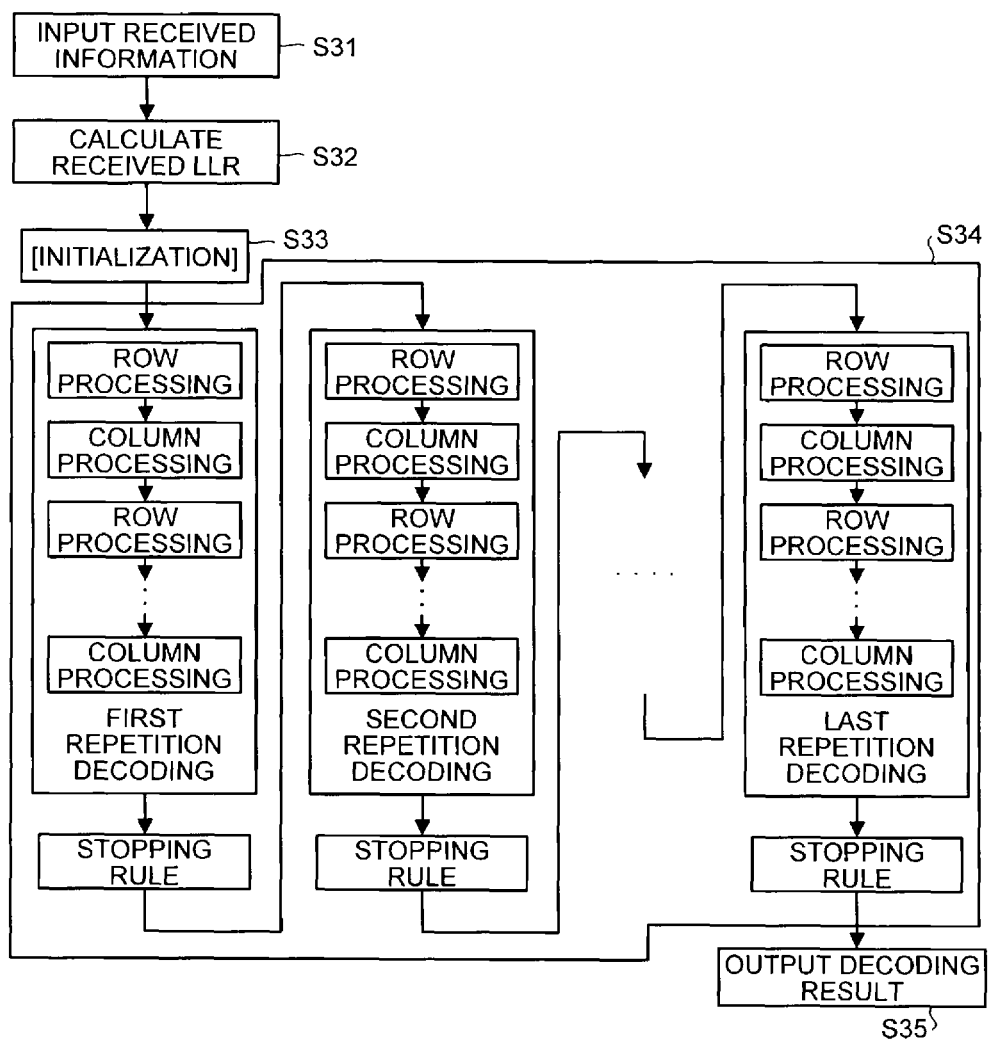
FIG. 13 is a flowchart showing a flow of processes in the "cyclic approximation min algorithm".

Next, a flow of processing in the "cyclic approximation min algorithm" according to the present embodiment will be explained using a flowchart in FIG. 13.

In the "cyclic approximation min algorithm", the received LLR is first calculated from the received information by the received-LLR calculation unit 11 (Steps S31, S32), the result is set in the intermediate-result storing unit 21 as an initial value (Step S33), and the repetition number of times is initialized as l=1 by the control unit 25 (Step S33). Then, using the λ adder unit 42, the minimum-k-value comparing unit 43, and the code operation unit 44 of the column processing unit 23, the operation of Equation (39) is cyclically performed for n=1 through n=N (Step S33).

The decode core unit 12 then performs repetition decoding operation in the l-th time (from the first time to the last time) under the control of the control unit 25 (Step S34) Specifically, as the first time of the repetition decoding, the row processing unit 22 performs the row processing (using the received LLR) for the row having "1" at the first column, and passes the result to the column processing unit 23. The column processing unit 23 then performs the column processing for the first column, and the intermediate-result storing unit 21 holds (updates) the result, $B_{mn(i)}$ and $S_m$. Thereafter, the similar processing is sequentially performed for the second column, the third column, . . . , the N-th column, and $B_{mn(i)}$ and $S_m$ as the respective results are held in the intermediate-result storing unit 21 (corresponding to the first repetition decoding). After the second repetition decoding, the decoding processing similar to that for the first time is performed except that the row processing is performed using LLR and $S_m$ updated in the previous processing.

After performing the repetition decoding for the l-th time, the decoding result determination unit 24 performs the hard decision of the posterior value calculated in the l-th repetition, determines a determined value as the decoding result x', and further performs the parity check (stopping rule). When the parity check result is OK ("Hx'=0") or the repetition number of times becomes $l=l_{max}$ in the stopping rule, the decoding result x' at that time is finally outputted (Step S35). If the two conditions are not satisfied, l=l+1 is set by the control unit 25 and the (l+1)-th repetition decoding is performed by the decode core unit 12.

Figure 14:
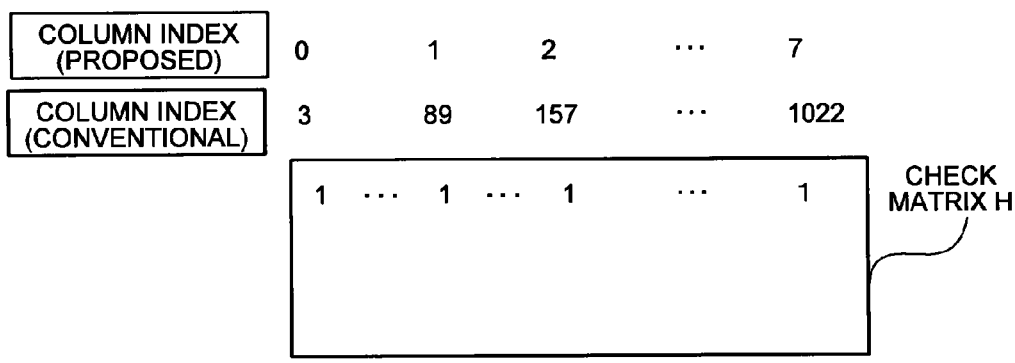
FIG. 14 is a view showing a column index notation.

Next, reduction in a memory size by a column index notation system will be explained. FIG. 14 is a view showing the column index notation according to the present embodiment. In the "cyclic approximation min algorithm", the column index is notated from n=0 in an ascending order. Although the column index n is represented by the column index of the parity check matrix itself (absolute column index) conventionally, in the present embodiment, the column indexes are represented by relative column indexes where the minimum column index "1" at the m-th row in the parity check matrix is n=0, the column index "1" at the next row after the m-th is n=1, and subsequently n=2, 3, . . . per "1". Namely, while the conventional system requires 15 bits to represent the column indexes when the absolute column index "1" of the parity check matrix is "32768", for example, the present embodiment allows the memory size to be reduced to 3 bits that can represent 0 to 7 when the row weight is 8, or to 4 bits that can represent 0 to 15 when the row weight is 16.

As explained above, in the present embodiment, the absolute value $|β_{mn}|$ of LLR for the row processing in the LDPC decoding is reduced to the minimum k value per row using a cyclic structure, the memory amount for holding them can be greatly reduced. For example, when the row weight is 20 and k=3, the memory amount can be reduced to 3/20 as compared to the conventional system. Additionally, by changing the column indexes from the absolute indexes (1, 3, 10, 15, . . . ) to the relative indexes (0, 1, 2, 3, . . . ), the memory amount can be further reduced.

Subsequently, an effect of using the common "Sum-product algorithm" or the "cyclic approximation min algorithm", for example, as the decoding processing for the codes configured in the processing according to the eighth embodiment will be explained.

While the common "Sum-product algorithm" requires holding LLRs for the row weights per row and performing function calculation for (the row weight−1) times per row, the "cyclic approximation min algorithm" only requires holding LLR for the k row weights from the minimum value in an ascending order and performing the function calculation for k-times per row. For example, in the "cyclic approximation min algorithm", because it is known that k of about 3 to 5 is sufficient for the row weight of 30, the memory amount can be reduced to 3/30 to 5/30 of the "Sum-product algorithm" and the calculation amount can also be reduced to 3/30 to 5/30 as compared to the row processing of the "Sum-product algorithm".

Meanwhile, as the encoding rate of the LDPC codes increases, the row weight generally increases. For example, in a case of a regular LDPC code with the column weight cw=4 and the row weight rw=8, the relationship of the encoding rate with the row weight and the column weight is "rate=(rw−cw)/rw" when the parity check matrix is a full-rank matrix. In this case, "rate=(8−4)/8=0.5". Accordingly, as the encoding rate increases while the column weight is constant, the row weight increases. For example, in a case of the column weight cw=4 and the encoding rate rate=0.9, "rate=(rw−cw)/rw" is "0.9=(rw−4)/rw", thus rw=40.

For the code with the high encoding rate and the large row weight, the calculation amount for the row processing increases when the common "Sum-product algorithm" is performed. For the LDPC code with the high encoding rate and the large row weight, the k value of the minimum k value used in the "cyclic approximation algorithm" may increase. For example, k=3 is sufficient in a case of the column weight of 10 or less and the encoding rate of about 0.6, whereas 5 or more ks may be required when the row weight becomes 30 or more.

Hence, for the code with the encoding rate rate=0.5 or less, which can obtain sufficient performance with k=3 due to the small row weight, the code is configured by expanding the parity check matrix without puncturing. If the memory for k increases due to the row weight being increased, the puncture is applied (see the eighth embodiment). By applying the puncture, the internal memory when performing the common "Sum-product algorithm" can be downsized. In addition, the high encoding rate can be achieved without increasing the row weight by applying the puncture, so that decoding performance is not degraded when employing the "cyclic approximation min algorithm" without the need to increase the number of ks because the row weight does not increase. Namely, without the need to increase the memory amount for k, any encoding rate can be supported without the decoding performance being degraded. Note herein that, although in the present embodiment the case that LLR is held for the k row weights from the minimum value in an ascending order per row is explained, LLR may be held for j ($j \leq k$) row weights among the k row weights from the minimum value in an ascending order.

Eleventh Embodiment

Subsequently, decoding processing (different with the decoding processing of the ninth embodiment) corresponding to the encoding processing using the irregular parity check matrix $H_{MQCL}$ generated by the processing of the first to ninth embodiments will be explained.

The LDPC decoding according to the present embodiment is applicable to a case that calculation and updating of probability information (LLR) by the row processing and the column processing are performed per bit or per predetermined plural bits, and intends to reduce the repetition number of times by parallelizing operation processing. In the present embodiment, the "cyclic approximation min algorithm" using so-called "Overlapped" $B_{mn}^{C}$ and $S_m$ is executed, in which $B_{mn(i)}$ and $S_m$ in the intermediate-result storing unit are considered as a set regardless of the number of parallelization and all the parallelized processing units update the same $B_{mn}^{C}$ and $S_m$. Hereinafter, the decoding algorithm according to the present embodiment is referred to as an "Overlapped cyclic approximation min algorithm".

Here, the "Overlapped cyclic approximation min algorithm" executed in the reception apparatus according to the present embodiment is shown below.

(Initialization Step)

First, the repetition number of times l=1 and the maximum repetition number of times $l_{max}$ are set. Moreover, initial LLR of the minimum k value at m-th row is set as $\beta_{mn(i)}^{(0)}$, a reception LLR: $\lambda_n$ is inputted, and $B_{mn(i)}^{C}$ is calculated as shown in following Equation (43). In addition, $sgn(\lambda_n)$ is inputted as a code of initial LLR: $\beta_{mn}^{(0)}$ at the m-th row and $S_m$ is calculated as shown in following Equation (43).

[Numerical Expression 39]

$$\beta_{mn'}^{C} = |\beta_{mn(i)}^{(0)}| = \min_{n \in N(m)\setminus\{n(1),n(2),\ldots,n(i-1)\}} [|\lambda_n|], \forall i \in [1, k]$$ (43)

$$S_m = \prod_{n \in N(m)} sgn(\lambda_n)$$

$$n(i) = \arg\min_{n \in N(m)\setminus\{n(1),n(2),\ldots,n(i-1)\}} [|\lambda_n|]$$

$$n(0) = \varphi$$

Where, $B_{mn(i)}^{C}$ is the absolute value of LLR: $\beta_{mn(i)}$ of the minimum k value at the m-th row, which is commonly used in parallelizing processing. In addition, n(i) is the column index of minimum i-th LLR in $B_{mn(i)}^{C}$.

(Row Processing Step)

Next, as the row processing step, LLR: $\alpha_{mn}^{(l)}$ of l-th repetition of a bit n to be transmitted from a check node m to a bit node n is updated by following Equation (44) for $0 \leq g \leq G-1$, $g \cdot N_G + 1 \leq n \leq (g+1) \cdot N_G$, and each m. Here, G is the number of parallelization and $N_G$ is the column index to be processed by each of parallelized decoding circuits. In addition, $G \cdot N_g = N$. In the present embodiment, a starting column of each row processing is arbitrary, and the decoding processing is cyclically performed again from the starting column after the processing is completed through the last column.

[Numerical Expression 40]

$$\alpha_{mn}^{(l)} = \prod_{\substack{n' \in N(m)\setminus n \\ n' < g \cdot N_G}} sgn(\beta_{mn'}^{(l)}) \cdot \prod_{\substack{n' \in N(m)\setminus n \\ n' > g \cdot N_G}} sgn(\beta_{mn'}^{(l-1)}) \cdot$$ (44)

$$\min_{n' \in N_k(m)\setminus n} [B_{mn'}^{C}]$$

$$= S_m \cdot sgn(\beta_{mn}^{(l-1)}) \cdot \min_{n' \in N_k(m)\setminus n} [B_{mn'}^{C}]$$

$$= S_m' \cdot \min_{n' \in N_k(m)\setminus n} [B_{mn'}]$$

$$S_m' = S_m \cdot sgn(\beta_{mn}^{(l-1)})$$

Specifically, G row processing units respectively assigned to each column group divided into G groups per column number: $N_G$ perform the row processing in parallel. Except that the G row processing units perform the processing in parallel and that all the processing units use the same $B_{mn}^{C}$, the operation is similar to that of the "cyclic approximation min algorithm".

(Column Processing Step)

Next, as the column processing, LLR: $\beta_{mn}^{(l)}$ of l-th repetition of the bit n to be transmitted from the bit node n to the check node m is updated by following Equation (45) for $0 \leq g \leq G-1$, $g \cdot N_G + 1 \leq n \leq (g+1) \cdot N_G$, and each m. Namely, in the present embodiment, the column processing shown in following Equation (45) is performed in parallel for each column after the row processing has been performed thereto as explained above.

[Numerical Expression 41]

$$\beta_{mn}^{(1)} = \lambda_n + \sum_{m' \in M(n)\setminus n} \alpha_{m'n}^{(1)}$$ (45)

$$S_m = S_m' \cdot sgn(\beta_{mn}^{(1)})$$

$$n(i) = \arg\min_{n' \in N_k(m)\setminus\{n(1),n(2),\ldots,n(i-1),n(i)\}} [B_{mn'}^{C}, |\beta_{mn}^{(1)}|]$$

$$B_{mn(i)}^{C} = \min_{n' \in N_k(m)\setminus\{n(1),n(2),\ldots,n(i-1),n(i)\}} [B_{mn'}^{C}, |\beta_{mn}^{(1)}|], \forall i \in [1, k]$$

For each n, a posterior value $\beta_n^{(l)}$ of the l-th repetition of the bit n is updated by following Equation (46) for the hard decision.

[Numerical Expression 42]

$$\beta_n^{(1)} = \lambda_n + \sum_{m' \in M(n)} \alpha_n^{(1)}$$ (46)

As for the stopping rule, it is similar to that in the "cyclic approximation min algorithm" explained above.

Subsequently, a configuration and operation of the LDPC decoder 5 according to the second embodiment that achieves the "Overlapped cyclic approximation min algorithm" will be explained.

Figure 15:
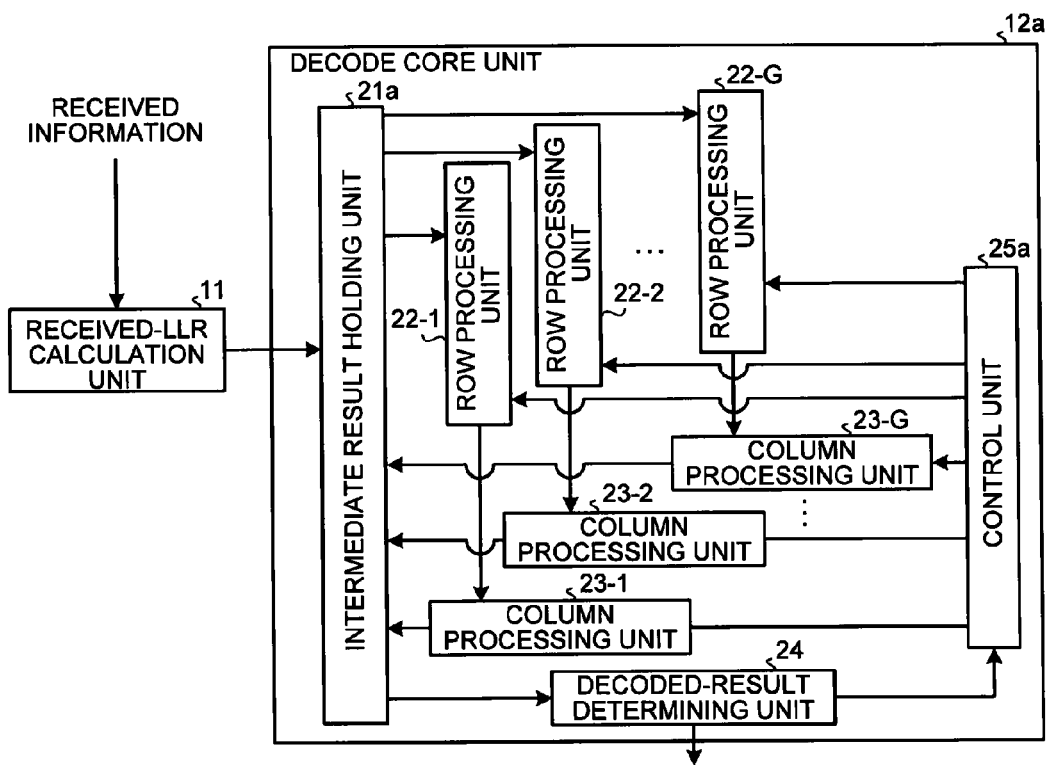
FIG. 15 is a view showing a configuration example of the LDPC decoder.

FIG. 15 is a view showing a configuration example of the LDPC decoder 5 according to the present embodiment, wherein it is configured by the received-LLR calculation unit 11 for calculating received LLR from the received information and the decode core unit 12a for performing the decoding processing. The decode core unit 12a is provided with an intermediate-result storing unit 21a configured by a memory for holding the intermediate result of decoding (intermediate value), row processing units 22-1 to 22-G for executing row processing, column processing units 23-1 to 23-G for executing column processing, a decoded-result determining unit 24 for performing hard decision of a posterior value in the column processing and accuracy determination of the parity check result as a stopping rule of the decoding processing, and a control unit 25a for performing repetition control of decoding.

In FIG. 15, the LDPC decoder 5 according to the present embodiment commonly uses $B_{mn}^C$ and $S_m$ in the intermediate-result storing unit 21a according to Equation (43), Equation (44), and Equation (45), and updates each of them when the respective row processing units and the respective column processing units perform processing in parallel. With this parallel processing, $B_{mn}^C$ and $S_m$ are rapidly updated depending on the number of parallelization, and thereby the repetition number of times of decoding can be greatly reduced.

Subsequently, an effect of using the "Overlapped cyclic approximation min algorithm", for example, as the decoding processing for the codes configured in the processing of the first to eighth embodiments will be explained.

For example, in a case where a problem occurs that the operation of the same row at the same clock occurs and the same buffer is referenced in the parallel processing as explained above, an approach with an additional circuit is conventionally required. It is applicable not only to the "cyclic approximation min algorithm" but also any other decoding methods.

To solve this problem, in the present embodiment, characteristics of the parity check matrix generated by masking the quasi-cyclic matrix composed of p-row×p-column cyclic permutation matrix are utilized to divide the column group for the parallel processing into G1=[0*p+1, 1*p+1, 2*p+1, ... ], G2=[0*p+2, 1*p+2, 2*p+2, ... ], G3=[0*p+3, 1*p+3, 2*p+3, ... ], ..., when performing the parallel processing in the decoding to avoid the occurrence of overlapping of the rows and the columns, and to perform the processing of all or part of the groups in parallel from the minimum value of elements in each group.

Figure 17:
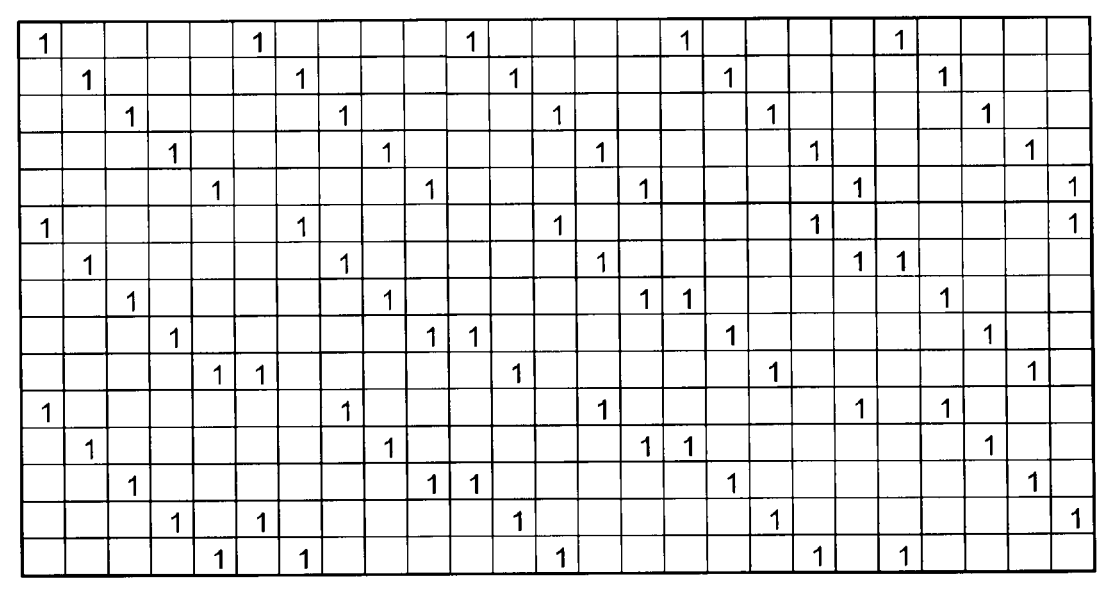

In the decoding processing of a specific column group, the rows related to the column are processed in parallel. For example, in a case of the quasi-cyclic code shown in FIG. 17 explained above, it is divided into G1=[1, 6, 11, 16, 21], G2=[2, 7, 12, 17, 22], G3=[3, 8, 13, 18, 23], G4=[4, 9, 14, 19, 24], and G5=[5, 10, 15, 20, 25]. Here, while processing G1, G2, G3, G4, G5 in parallel, the first element column in each group, 1, 2, 3, 4, and 5, are processed in parallel, and the elements of the next column, 6, 7, 8, 9, and 10, are then processed, so that the columns are not overlapped. The column index of the first element in G1 is 1 and the row indexes related thereto are 1, 6, and 11, so that these three rows can be processed in parallel. At the same time, the column index of the first element in G2 is 2 and the row indexes related thereto are 2, 7, and 12, so that these three rows can also be processed in parallel and are not overlapped with the row index processed in G1. Similarly, the rows and the columns are not overlapped in all the groups, so that the parallel processing without overlapping can be performed by grouping as explained above without a particular additional circuit.

It should be noted that, while a case where the "cyclic approximation min algorithm" is processed in parallel is described in the present embodiment, it is not limited thereto, and the present embodiment is similarly applicable to a case where other decoding systems for LDPC are processed in parallel as long as the system is for performing the encoding utilizing the parity check matrix generated by masking the quasi-cyclic matrix composed of the cyclic permutation matrix.

Twelfth Embodiment

Subsequently, a system to which the encoding processing/decoding processing according to the first to eleventh embodiments is applied will be explained. For example, the LDPC encoding processing and decoding processing according to the present invention can apply to whole telecommunication equipment, such as mobile communications (terminal, base station), wireless LAN, optical communications, satellite communications, a quantum encryption device, and specifically, the LDPC encoder 1 and the LDPC decoder 5 shown in FIG. 1, as well as the Erasure-LDPC encoding unit 82 and the erasure-LDPC decoding unit 86 shown in FIG. 5, are incorporated in each telecommunication equipment to perform error correction.

Figure 16:
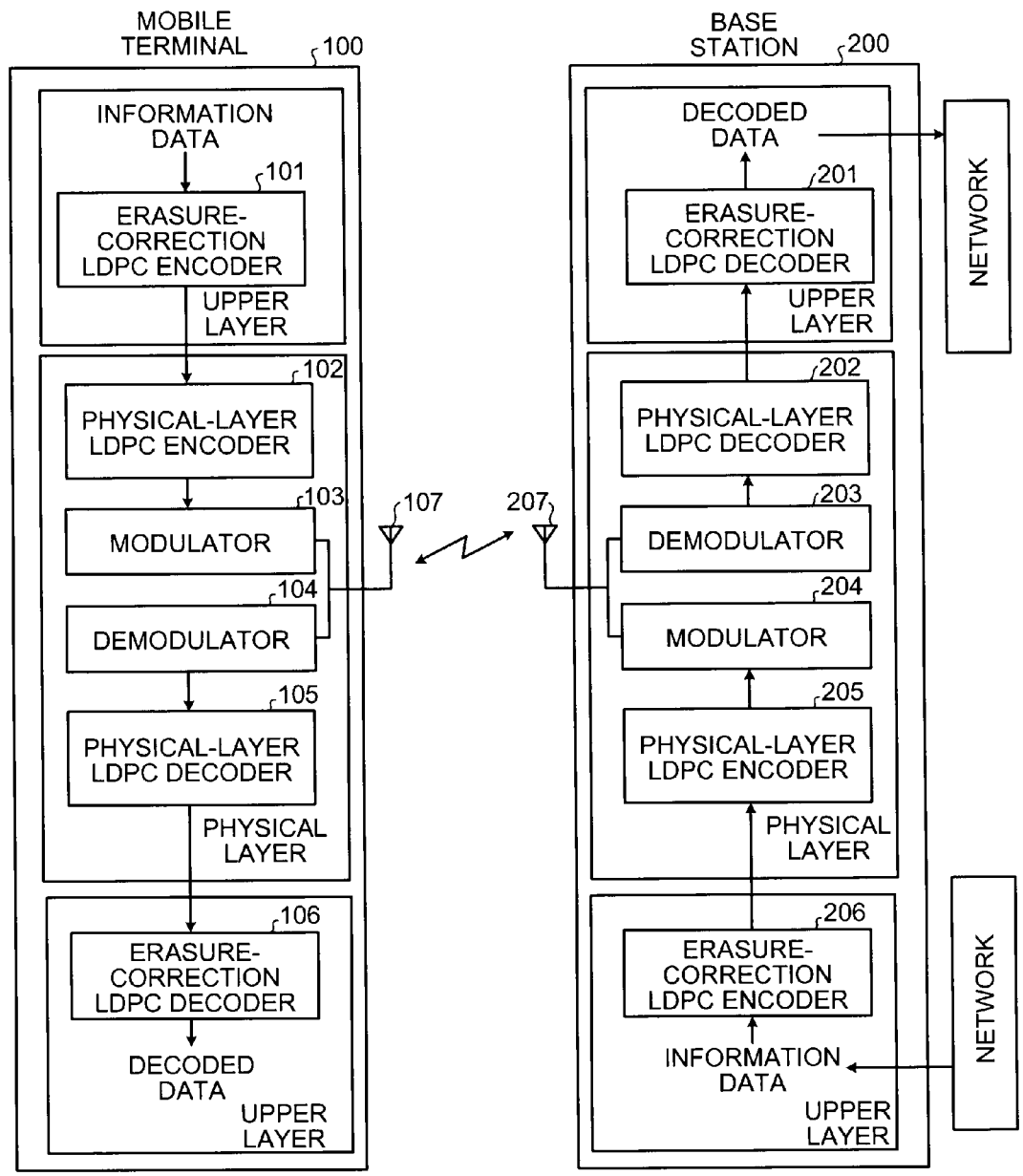
FIG. 16 is a view showing a configuration example when encoding processing/decoding processing according to the present invention to a mobile communications system.
Figure 18:
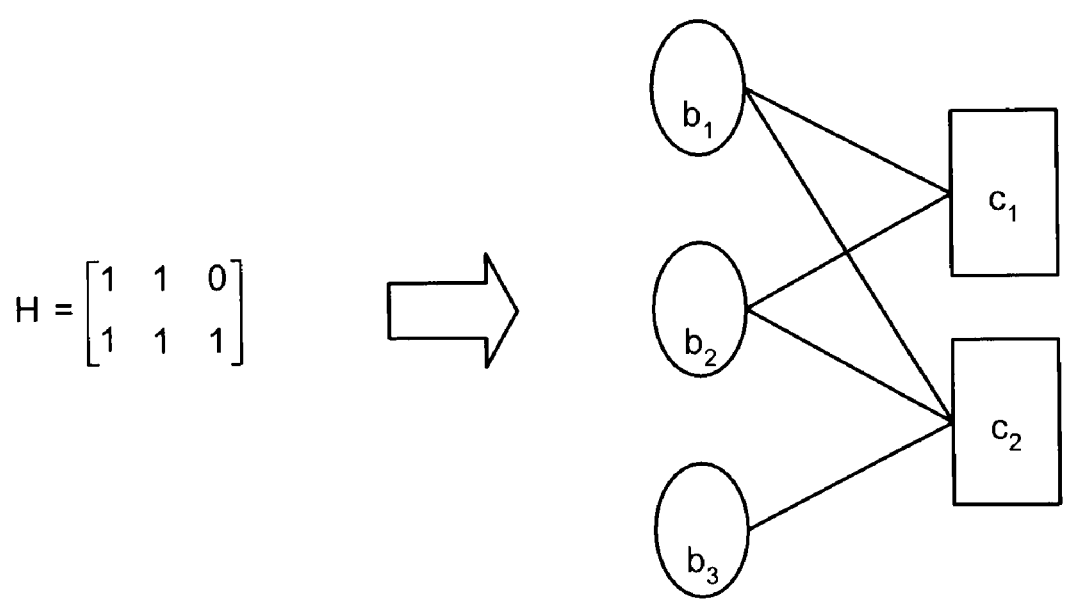
FIG. 18 is a view showing a case in which one example of the check matrix is represented by a Tanner graph.

FIG. 16 is a view showing a configuration example when the encoding processing/decoding processing according to the present invention is applied to a mobile communications system provided with a mobile terminal 100 and a base station 200 that communicates with the mobile terminal 100, wherein the mobile terminal 100 is provided with an erasure-correction LDPC encoder 101, a physical-layer LDPC encoder 102, a modulator 103, a demodulator 104, a physical-layer LDPC decoder 105, an erasure-correction LDPC decoder 106, and an antenna 107, while the base station 200 is provided with an erasure-correction LDPC decoder 201, a physical-layer LDPC decoder 202, a demodulator 203, a modulator 204, a physical-layer LDPC encoder 205, an erasure-correction LDPC encoder 206, and an antenna 207.

Moreover, in the mobile terminal 100 and the base station 200 shown in FIG. 16, the physical-layer LDPC encoder 102 and the physical-layer LDPC decoder 105 applied to fading communication channels or the like are incorporated in the physical layers, and the erasure-correction LDPC encoder 101 and the erasure-correction LDPC decoder 106 are incorporated in upper layers of data link layers or the like. Here, any configuration of the LDPC encoders explained in the first to seventh, and ninth embodiments is applied to the physical-layer LDPC encoders in the mobile terminal 100 and the base station 200, while any configuration of the LDPC decoders explained in the tenth or eleventh embodiment is applied to the physical-layer LDPC decoders in the mobile terminal 100 and the base station 200. Meanwhile, the encoding unit and the decoding unit shown in FIG. 5 of the eighth embodiment are applied to the erasure-correction LDPC encoders and erasure-correction LDPC decoders of the mobile terminal 100 and the base station 200.

When data is transmitted from the mobile terminal 100 in the mobile communications system composed as described above, first, information data, such as voice, mail, and WEB, is packetized as data, for example, to then encode it by the erasure-correction LDPC encoder 101. Next, in the physical layer, the physical-layer LDPC encoder 102 for fading communication channel encodes this packet data unit. This encoded data is sent out to a radio communication channel via the modulator 103 and the antenna 107.

Meanwhile, in the base station 200, received signals including errors generated in the radio communication channel are received via the antenna 207 and the demodulator 203, and received data after demodulation is corrected by the physical-layer LDPC decoder 202 for the physical layer. In the physical layer, whether the error correction is successfully performed per packet is then notified to the upper layer. In the upper layer, the erasure-correction LDPC decoder 201 reproduces the information packet using only the packets whose error correction is succeeded. Subsequently, this information packet is transmitted to a communication destination via the network. Note that also when the mobile terminal 100 receives various data from the network, the base station 200 transmits the encoded data to the mobile terminal 100, and the mobile terminal 100 reproduces the various data, by the processing similar to that described above. When the base station 200 transmits the encoded data to the mobile terminal 100, first, information data, such as voice, mail, and WEB, is packetized as data, for example, to then encode it by the erasure-correction LDPC encoder 206. Next, the physical-layer LDPC encoder 205 for fading communication channel encodes this packet data unit in the physical layer. This encoded data is sent out to the radio communication channel via the modulator 204 and the antenna 207. Meanwhile, in the mobile terminal 200, received signals including errors generated in the radio communication channel are received via the antenna 107 and the demodulator 104, the received data after demodulation is corrected by the physical-layer LDPC decoder 105. In the physical layer, whether the error correction is successfully performed per packet is then notified to the upper layer. In the upper layer, the erasure-correction LDPC decoder 106 reproduces the information packet using only the packets whose error correction is succeeded.

INDUSTRIAL APPLICABILITY

As described above, the check-matrix generating method and encoding method according to the present invention are useful as the encoding technology in digital communications, and are particularly suitable for the communication apparatuses that employ the LDPC codes as the encoding system.

The invention claimed is:

1. A method of generating a parity check matrix for low-density parity check codes, the method comprising:
   mask-matrix generating including
      preparing a regular quasi-cyclic matrix with uniform weights of a row and a column in which cyclic permutation matrices are arranged in row and column directions and specific regularity is given to the cyclic permutation matrices,
      deriving a conditional expression for assuring a predetermined minimum loop in the parity check matrix to be finally generated, and
      generating a mask matrix for converting a specific cyclic permutation matrix into a zero-matrix based on the conditional expression and a predetermined weight distribution;
   masking including converting the specific cyclic permutation matrix in the regular quasi-cyclic matrix into the zero-matrix using the mask matrix to generate an irregular masking quasi-cyclic matrix with nonuniform weights of the row and the column; and
   check-matrix generating including generating an irregular parity check matrix with a low-density generation matrix structure in which the masking quasi-cyclic matrix and a matrix in which the cyclic permutation matrices are arranged in a staircase manner are arranged in a predetermined location.

2. The method according to claim 1, wherein the mask-matrix generating includes, when assuming the quasi-cyclic matrix with J-row×L-column without loop 4, which is p-row×p-column cyclic permutation matrices arranged in J number in a row direction and L number in a column direction and expressed by the cyclic permutation matrix as a unit, as the regular quasi-cyclic matrix, giving specific regularity to the quasi-cyclic matrix with J-row×L-column, in which a column index "1" of the first row of the cyclic permutation matrix arranged at j-row ($0 \leq j \leq J-1$) and l-column ($0 \leq l \leq L-1$) is "$(j+c)\cdot(l+d)$", where c and d are arbitrary integers equal to or larger than zero, and "$(j+c)\cdot(l+d) < p$" is satisfied.

3. The method according to claim 2, wherein the mask-matrix generating includes
   deriving a conditional expression in which the regular quasi-cyclic matrix includes the loop 6 as the conditional expression, and
   configuring the mask matrix that does not satisfy the conditional expression as a condition of constraint.

4. The method according to claim 3, further comprising:
   deriving a conditional expression for the loop 6 configured between the regular quasi-cyclic matrix and the cyclic permutation matrices arranged in a staircase manner; and
   configuring the mask matrix that does not satisfy the two conditional expressions as the condition of constraint.

5. The method according to claim 4, further comprising:
   deriving a conditional expression for loop 8, loop 10, and so on, as needed, in addition to the conditional expression for the loop 6; and
   adaptively configuring the mask matrix that does not satisfy the conditional expression for the loop 6, the conditional expressions for the loops 6 and 8, the conditional expressions for the loops 6, 8, and 10, and so on, as the condition of constraint.

6. A method of generating a parity check matrix for low-density parity check codes, the method comprising:
   mask-matrix generating including
      preparing a regular quasi-cyclic matrix with uniform weights of a row and a column in which the specific regularity according to claim 2 is given,
      preparing finite geometric codes based on a predetermined weight distribution, and
      permutating regularly the finite geometric codes based on a predetermined operational expression to generate a mask matrix for converting a specific cyclic permutation matrix into a zero-matrix;
   masking including converting the specific cyclic permutation matrix in the regular quasi-cyclic matrix into the zero-matrix using the mask matrix to generate an irregular masking quasi-cyclic matrix with nonuniform weights of the row and the column; and
   check-matrix generating including generating an irregular parity check matrix with a low-density generation matrix structure in which the masking quasi-cyclic matrix and a matrix in which the cyclic permutation matrices are arranged in a staircase manner are arranged in a predetermined location.

7. The method according to claim 1, wherein the mask-matrix generating includes, when assuming the quasi-cyclic matrix with J-row×L-column without the loop 4, which is p-row×p-column cyclic permutation matrices arranged in J number in the row direction and L number in the column direction and expressed by the cyclic permutation matrix as a unit, as the regular quasi-cyclic matrix, giving specific regularity to the quasi-cyclic matrix with J-row×L-column, in which a column index "1" of the first row of the cyclic permutation matrix arranged at j-row ($0 \leq j \leq J-1$) and l-column ($0 \leq l \leq L-1$) is "$(j+c) \cdot (l+d) \mod p$", where c and d are arbitrary integers equal to or larger than zero.

8. The method according to claim 7, wherein the mask-matrix generating includes
deriving a conditional expression in which the regular quasi-cyclic matrix includes the loop 6 as the conditional expression, and
configuring the mask matrix that does not satisfy the conditional expression as the condition of constraint.

9. The method according to claim 8, further comprising:
deriving a conditional expression for the loop 6 configured between the regular quasi-cyclic matrix and the cyclic permutation matrices arranged in a staircase manner; and
configuring the mask matrix that does not satisfy the two conditional expressions as the condition of constraint.

10. The method according to claim 9, further comprising deriving a conditional expression for the loop 8, the loop 10, and so on, as needed, in addition to the conditional expression for the loop 6;
and adaptively configuring the mask matrix that does not satisfy the conditional expression for the loop 6, the conditional expressions for the loops 6 and 8, the conditional expressions for the loops 6, 8, and 10, and so on, as the condition of constraint.

11. A method of generating a parity check matrix for low-density parity check codes, the method comprising:
mask-matrix generating including
preparing a regular quasi-cyclic matrix with uniform weights of a row and a column in which the specific regularity according to claim 7 is given,
preparing finite geometric codes based on a predetermined weight distribution, and
permutating regularly the finite geometric codes based on a predetermined operational expression to generate a mask matrix for converting a specific cyclic permutation matrix into a zero-matrix;
masking including converting the specific cyclic permutation matrix in the regular quasi-cyclic matrix into the zero-matrix using the mask matrix to generate a irregular masking quasi-cyclic matrix; and
check-matrix generating including generating an irregular parity check matrix with a low-density generation matrix structure in which the masking quasi-cyclic matrix and a matrix in which the cyclic permutation matrices are arranged in a staircase manner are arranged in a predetermined location.

12. The method according to claim 1, wherein the mask-matrix generating includes, when assuming the quasi-cyclic matrix with J-row×L-column without the loop 4, which is p-row×p-column cyclic permutation matrices arranged in J number in the row direction and L number in the column direction and expressed by the cyclic permutation matrix as a unit, as the regular quasi-cyclic matrix, giving specific regularity to the quasi-cyclic matrix with J-row×L-column, in which a column index "1" of the first row of the cyclic permutation matrix arranged at j-row ($0 \leq j \leq J-1$) and l-column ($0 \leq l \leq L-1$) is "$q^{(j+c)} \cdot q^{(l+d)}$", where c and d are arbitrary integers equal to or larger than zero, and "$q^{(j+c)} \cdot q^{(l+d)} < p$" is satisfied.

13. The method according to claim 12, wherein the mask-matrix generating includes
deriving a conditional expression in which the regular quasi-cyclic matrix includes the loop 6 as the conditional expression, and
configuring the mask matrix that does not satisfy the conditional expression as the condition of constraint.

14. The method according to claim 13, further comprising:
deriving a conditional expression for the loop 6 configured between the regular quasi-cyclic matrix and the cyclic permutation matrices arranged in a staircase manner; and
configuring the mask matrix that does not satisfy the two conditional expressions as the condition of constraint.

15. The method according to claim 14, further comprising:
deriving a conditional expression for the loop 8, the loop 10, and so on, as needed, in addition to the conditional expression for the loop 6; and
adaptively configuring the mask matrix that does not satisfy the conditional expression for the loop 6, the conditional expressions for the loops 6 and 8, the conditional expressions for the loops 6, 8, and 10, and so on, as the condition of constraint.

16. The method according to claim 1, wherein the mask-matrix generating includes, when assuming the quasi-cyclic matrix with J-row×L-column without the loop 4, which is p-row×p-column cyclic permutation matrices arranged in J number in the row direction and L number in the column direction and expressed by the cyclic permutation matrix as a unit, as the regular quasi-cyclic matrix, giving specific regularity to the quasi-cyclic matrix with J-row×L-column, in which a column index "1" of the first row of the cyclic permutation matrix arranged at j-row ($0 \leq j \leq J-1$) and l-column ($0 \leq l \leq L-1$) is "$q^{(j+c)} \cdot q^{(l+d)} \mod p$", where q is a positive integer, and c and d are arbitrary integers equal to or larger than zero.

17. The method according to claim 16, wherein the mask-matrix generating step includes
deriving a conditional expression in which the regular quasi-cyclic matrix includes the loop 6 as the conditional expression, and
configuring the mask matrix that does not satisfy the conditional expression as the condition of constraint.

18. The method according to claim 17, further comprising:
deriving a conditional expression for the loop 6 configured between the regular quasi-cyclic matrix and the cyclic permutation matrices arranged in a staircase manner; and
configuring the mask matrix that does not satisfy the two conditional expressions as the condition of constraint.

19. The method according to claim 18, further comprising:
deriving a conditional expression for loop 8, loop 10, and so on, as needed, in addition to the conditional expression for the loop 6; and
adaptively configuring the mask matrix that does not satisfy the conditional expression for the loop 6, the conditional expressions for the loops 6 and 8, the conditional expressions for the loops 6, 8, and 10, and so on, as the condition of constraint.

20. The method according to claim 1, wherein the mask-matrix generating includes calculating the weight distribution of the mask matrix by a density evolution method.

21. A method of encoding predetermined information bits using a parity check matrix for low-density parity check codes, the method comprising:
encoding the predetermined information bits using a irregular parity check matrix generated by
preparing a regular quasi-cyclic matrix with uniform weights of a row and a column in which cyclic permutation matrices are arranged in row and column directions and specific regularity is given to the cyclic permutation matrices, deriving a conditional expression for assuring a predetermined minimum loop in the parity check matrix to be finally generated, generating a mask matrix for converting a specific cyclic permutation matrix into a zero-matrix based on the conditional expression and a predetermined weight distribution, converting the specific cyclic permutation matrix in the regular quasi-cyclic matrix into the zero-matrix using the mask matrix to generate an irregular masking quasi-cyclic matrix with nonuniform weights of the row and the column, and generating the irregular parity check matrix with a low-density generation matrix structure in which the masking quasi-cyclic matrix and a matrix in which the cyclic permutation matrices are arranged in a staircase manner are arranged in a predetermined location.

22. The method according to claim 21, wherein the encoding includes, when configuring a code with a code length N, where N is information length K+parity length M, determining M-bit parity for every bits sequentially from a (K+1)-th bit to an N-th bit based on a predetermined operational expression generated under the condition that a product of the code and the irregular parity check matrix becomes zero when a message with the information length K is given.

23. The method according to claim 22, wherein, when configuring the low-density parity check codes corresponding to a plurality of encoding rates, a code of a specific encoding rate is set as a reference, the irregular parity check matrix is expanded while maintaining a configuration of the irregular parity check matrix with a low-density generation matrix structure corresponding to the specific encoding rate generated in the check-matrix generating step for the encoding rate lower than the specific encoding rate, and the parity of the code with the specific encoding rate is thinned out for the encoding rate higher than the specific encoding rate.

24. The method according to claim 23, wherein the expanded parity check matrix maintains the low-density generation matrix structure.

25. The method according to claim 24, wherein bit intervals are rendered to be as long as possible in the processing of thinning out the parity of the code with the specific encoding rate.

26. A method of performing erasure correction encoding of predetermined information bits, the method comprising:

generating erasure correction codes using an irregular masking quasi-cyclic matrix generated by preparing a regular quasi-cyclic matrix with uniform weights of a row and a column in which cyclic permutation matrices are arranged in row and column directions and specific regularity is given to the cyclic permutation matrices, deriving a conditional expression for assuring a predetermined minimum loop in the parity check matrix to be finally generated, generating a mask matrix for converting a specific cyclic permutation matrix into a zero-matrix based on the conditional expression and a predetermined weight distribution, converting the specific cyclic permutation matrix in the regular quasi-cyclic matrix into the zero-matrix using the mask matrix to generate the irregular masking quasi-cyclic matrix with nonuniform weights of the row and the column, and generating the irregular parity check matrix with a low-density generation matrix structure in which the masking quasi-cyclic matrix and a matrix in which the cyclic permutation matrices are arranged in a staircase manner are arranged in a predetermined location.

27. A method of decoding a code low-density parity check encoded by encoding the predetermined information bits using a irregular parity check matrix generated by preparing a regular quasi-cyclic matrix with uniform weights of a row and a column in which cyclic permutation matrices are arranged in row and column directions and specific regularity is given to the cyclic permutation matrices, deriving a conditional expression for assuring a predetermined minimum loop in the parity check matrix to be finally generated, generating a mask matrix for converting a specific cyclic permutation matrix into a zero-matrix based on the conditional expression and a predetermined weight distribution, converting the specific cyclic permutation matrix in the regular quasi-cyclic matrix into the zero-matrix using the mask matrix to generate an irregular masking quasi-cyclic matrix with nonuniform weights of the row and the column, and generating the irregular parity check matrix with a low-density generation matrix structure in which the masking quasi-cyclic matrix and a matrix in which the cyclic permutation matrices are arranged in a staircase manner are arranged in a predetermined location using the parity check matrix, the decoding method comprising:

performing a row processing to operate a logarithmic likelihood ratio used in column processing (logarithmic likelihood ratio transmitted from a check node to a bit node: referred to as column processing LLR) based on an absolute value of a logarithmic likelihood ratio corresponding to a row weight of the parity check matrix (logarithmic likelihood ratio transmitted from the bit node to the check node referred to as row processing LLR); and performing a column processing to operate the row processing LLR used in the row processing using the column processing LLR corresponding to a column weight operated by the row processing, and further to hold the minimum k value of the absolute value of the row processing LLR corresponding to the row weight in a specific region of a memory, wherein the row processing and the column processing are performed while updating the minimum k value of the row to perform the decoding.

28. The method according to claim 27, wherein the column of the parity check matrix is divided into a predetermined number of groups, the row processing and the column processing are performed in parallel per divided group, the region of the memory holding the minimum k value is shared, and the minimum k value is updated by each column processing performed in parallel.

29. The method according to claim 28, wherein characteristics of the parity check matrix are utilized to divide the group into $G1=[0*p+1, 1*p+1, 2*p+1, \ldots ]$, $G2=[0*p+2, 1*p+2, 2*p+2, \ldots ]$, $G3=[0*p+3, 1*p+3, 2*p+3, \ldots ], \ldots$, when performing the parallel processing, and the parallel processing of all or part of the groups is performed from the minimum value of elements in each group.

30. A communication apparatus on a transmission side or a reception side, the communication apparatus generating a parity check matrix for low-density parity check codes, wherein an irregular parity check matrix with a low-density generation matrix structure is generated by preparing a regular quasi-cyclic matrix with uniform weights of a row and a column in which cyclic permutation matrices are arranged in row and column directions and specific regularity is given to the cyclic permutation matrices, deriving a conditional expression for assuring a predetermined minimum loop in the parity check matrix to be finally generated, generating a mask matrix for converting a specific cyclic permutation matrix into a zero-matrix based on the conditional expression and a predetermined weight distribution, converting the specific cyclic permutation matrix in the regular quasi-cyclic matrix into the zero-matrix using the mask matrix to generate an irregular masking quasi-cyclic matrix with nonuniform weights of the row and the column, and generating the irregular parity check matrix with a low-density generation matrix structure in which the masking quasi-cyclic matrix and a matrix in which the cyclic permutation matrices are arranged in a staircase manner are arranged in a predetermined location.

31. The communication apparatus on the transmission-side according to claim 30, wherein the communication apparatus encodes predetermined information bits using a parity check matrix for low-density parity check codes, and the communication apparatus comprises a low-density parity check encoder that encodes predetermined information bits using the irregular parity check matrix.

32. The communication apparatus on the reception-side according to claim 30, wherein the communication apparatus decodes a code low-density parity check encoded on the transmission-side using a parity check matrix, the communication apparatus comprises a low-density parity check decoder that decodes a code by performing a row processing to operate a logarithmic likelihood ratio used in column processing (logarithmic likelihood ratio transmitted from a check node to a bit node: referred to as column processing LLR) based on an absolute value of a logarithmic likelihood ratio corresponding to a row weight of the parity check matrix (logarithmic likelihood ratio transmitted from the bit node to the check node referred to as row processing LLR), and performing a column processing to operate the row processing LLR used in the row processing using the column processing LLR corresponding to a column weight operated by the row processing, and further to hold the minimum k value of the absolute value of the row processing LLR corresponding to the row weight in a specific region of a memory, and the row processing and the column processing are performed while updating the minimum k value of the row to perform the decoding.

33. A communication system that employs low-density parity check codes as an error correction code, the communication system comprising:

a transmission apparatus that encodes predetermined information bits by encoding the predetermined information bits using a irregular parity check matrix generated by preparing a regular quasi-cyclic matrix with uniform weights of a row and a column in which cyclic permutation matrices are arranged in row and column directions and specific regularity is given to the cyclic permutation matrices, deriving a conditional expression for assuring a predetermined minimum loop in the parity check matrix to be finally generated, generating a mask matrix for converting a specific cyclic permutation matrix into a zero-matrix based on the conditional expression and a predetermined weight distribution, converting the specific cyclic permutation matrix in the regular quasi-cyclic matrix into the zero-matrix using the mask matrix to generate an irregular masking quasi-cyclic matrix with nonuniform weights of the row and the column, and generating the irregular parity check matrix with a low-density generation matrix structure in which the masking quasi-cyclic matrix and a matrix in which the cyclic permutation matrices are arranged in a staircase manner are arranged in a predetermined location; and a reception apparatus that decodes a code by performing a row processing to operate a logarithmic likelihood ratio used in column processing (logarithmic likelihood ratio transmitted from a check node to a bit node: referred to as column processing LLR) based on an absolute value of a logarithmic likelihood ratio corresponding to a row weight of the parity check matrix (logarithmic likelihood ratio transmitted from the bit node to the check node referred to as row processing LLR), and performing a column processing to operate the row processing LLR used in the row processing using the column processing LLR corresponding to a column weight operated by the row processing, and further to hold the minimum k value of the absolute value of the row processing LLR corresponding to the row weight in a specific region of a memory, wherein the row processing and the column processing are performed while updating the minimum k value of the row to perform the decoding.

34. An encoder that encodes predetermined information bits using a parity check matrix for low-density parity check codes, the encoder comprising:

an encoding unit that performs encoding using an irregular parity check matrix with a low-density generation matrix structure generated by arranging, in a predetermined location, a regular quasi-cyclic matrix with uniform weights of a row and a column in which cyclic permutation matrices are arranged in row and column directions and specific regularity is given to the cyclic permutation matrices, an irregular masking quasi-cyclic matrix with nonuniform weights of the row and the column generated by converting a specific cyclic permutation matrix in the regular quasi-cyclic matrix into a zero-matrix using a mask matrix for converting the specific cyclic permutation matrix into the zero-matrix generated based on a condition for assuring a predetermined minimum loop in the parity check matrix to be finally generated and a predetermined weight distribution, and a matrix with the cyclic permutation matrices arranged in a staircase manner.

35. A decoder that decodes codes encoded by an encoder that encodes predetermined information bits using a parity check matrix for low-density parity check codes, the encoder including an encoding unit that performs encoding using an irregular parity check matrix with a low-density generation matrix structure generated by arranging, in a predetermined location, a regular quasi-cyclic matrix with uniform weights of a row and a column in which cyclic permutation matrices are arranged in row and column directions and specific regularity is given to the cyclic permutation matrices, an irregular masking quasi-cyclic matrix with nonuniform weights of the row and the column generated by converting a specific cyclic permutation matrix in the regular quasi-cyclic matrix into a zero-matrix using a mask matrix for converting the specific cyclic permutation matrix into the zero-matrix generated based on a condition for assuring a predetermined minimum loop in the parity check matrix to be finally generated and a predetermined weight distribution, and a matrix with the cyclic permutation matrices arranged in a staircase manner, the decoder comprising:

a decoding unit that performs decoding using an irregular parity check matrix with a low-density generation matrix structure generated by arranging, in a predetermined location, a regular (weights of a row and a column are uniform) quasi-cyclic matrix in which cyclic permutation matrices are arranged in row and column directions and specific regularity is given to the cyclic permutation matrices, an irregular (weights of the row and the column are nonuniform) masking quasi-cyclic matrix generated by converting a specific cyclic permutation matrix in the regular quasi-cyclic matrix into a zero-matrix using a mask matrix for converting the specific cyclic permutation matrix into the zero-matrix generated based on a condition for assuring a predetermined minimum loop in the parity check matrix to be finally generated and a predetermined weight distribution, and a matrix with the cyclic permutation matrices arranged in a staircase manner.

* * * * *